(12) United States Patent
Clerk et al.

(10) Patent No.: US 10,725,131 B2
(45) Date of Patent: Jul. 28, 2020

(54) TOPOLOGICALLY-PROTECTED TRAVELING-WAVE AMPLIFIER

(71) Applicants: THE ROYAL INSTITUTION FOR THE ADVANCEMENT OF LEARNING/MCGILL UNIVERSITY, Montreal (CA); FRIEDRICH-ALEXANDER-UNIVERSITAT ERLANGEN-NURNBERG, Erlangen (CA)

(72) Inventors: Aashish Clerk, Chicago, IL (US); Martin Houde, Longueuil (CA); Florian Marquardt, Nuremberg (DE); Vittorio Peano Cavasola, Gzira (MT)

(73) Assignees: THE ROYAL INSTITUTION FOR THE ADVANCEMENT OF LEARNING/MCGILL UNIVERSITY, Montreal (CA); FRIEDRICH-ALEXANDER-UNIVERSITAT ERLANGEN-NURNBERG, Erlangen (DE)

( * ) Notice: Subject to any disclaimer, the term of this patent is extended or adjusted under 35 U.S.C. 154(b) by 270 days.

(21) Appl. No.: 15/697,092

(22) Filed: Sep. 6, 2017

(65) Prior Publication Data
US 2018/0067182 A1    Mar. 8, 2018

Related U.S. Application Data

(60) Provisional application No. 62/384,086, filed on Sep. 6, 2016, provisional application No. 62/467,528, filed on Mar. 6, 2017.

(51) Int. Cl.
G01R 33/48    (2006.01)
H03F 1/56    (2006.01)
(Continued)

(52) U.S. Cl.
CPC .......... G01R 33/4802 (2013.01); H03F 1/56 (2013.01); H03F 3/189 (2013.01); H03F 3/20 (2013.01);
(Continued)

(58) Field of Classification Search
CPC ....... G06N 3/00; H01L 21/00; H01L 2221/00; H03F 1/00; H03F 2200/00; H03H 1/00;
(Continued)

(56) References Cited

U.S. PATENT DOCUMENTS 5,504,772 A * 4/1996 Deacon ................... H01S 3/063
372/102
9,052,448 B2    6/2015 Hafezi et al.
(Continued)

OTHER PUBLICATIONS

Anderson et al., "Engineering Topological Many-Body Materials in Microwave Cavity Arrays" Physical Review X, 2016, vol. 6, article 041043, pp. 1-11.
(Continued)

Primary Examiner — Jermele M Hollington
Assistant Examiner — Temilade S Rhodes-Vivour
(74) Attorney, Agent, or Firm — BCF LLP

(57) ABSTRACT

A topologically-protected traveling-wave amplifier includes resonators arranged in a two-dimensional array defining a periphery including a first edge. An output line is coupled to an output resonator disposed along the first edge spaced from an input resonator coupled to an output line. A synthetic gauge field generator associated with the resonators provides a topologically-protected edge state corresponding to propagation along the periphery in a propagation direction from the input resonator along the first edge to the output resonator. A parametric driving element creates pairs of photons in the edge state and amplifies a signal propagating along the first edge in the propagation direction. A signal incident from the input line propagates in the propagation
(Continued)

direction along the first edge while being amplified and is detected at the output line as an amplified signal. A signal incident from the output line is attenuated before emerging at the input resonator.

19 Claims, 14 Drawing Sheets

(51) Int. Cl.
| | | |
|---|---|---|
| H03F 7/02 | (2006.01) | |
| H03F 3/20 | (2006.01) | |
| H03F 3/213 | (2006.01) | |
| H03F 3/189 | (2006.01) | |
| H03F 19/00 | (2006.01) | |

(52) U.S. Cl.
CPC ............ *H03F 3/213* (2013.01); *H03F 7/02* (2013.01); *H03F 19/00* (2013.01)

(58) Field of Classification Search
CPC ......... H03H 2210/00; H01P 1/00; H01S 1/00; H01S 2301/00
See application file for complete search history.

(56) References Cited

U.S. PATENT DOCUMENTS

| | | | | |
|---|---|---|---|---|
| 9,696,492 | B1* | 7/2017 | Cox | G02B 6/1225 |
| 2005/0077979 | A1* | 4/2005 | Tzuang | H01P 3/00 |
| | | | | 333/125 |
| 2005/0238079 | A1* | 10/2005 | Botez | B82Y 20/00 |
| | | | | 372/96 |
| 2008/0151349 | A1* | 6/2008 | Hochberg | H01S 1/02 |
| | | | | 359/258 |
| 2009/0022445 | A1* | 1/2009 | Hochberg | B82Y 20/00 |
| | | | | 385/3 |
| 2014/0034848 | A1* | 2/2014 | Campbell | F03G 6/00 |
| | | | | 250/492.1 |
| 2014/0346357 | A1* | 11/2014 | Jarrahi | H01L 31/09 |
| | | | | 250/338.4 |
| 2016/0352515 | A1* | 12/2016 | Bunandar | H04L 9/0852 |

OTHER PUBLICATIONS

Anderson et al., "Engineering Topological Many-Body Materials in Microwave Cavity Arrays" James Franck Institute and the University of Chicago, 2016, arXiv: 1605.03177v1, pp. 1-11.
Hafezi et al., "Robust optical delay lines with topological protection" Nature Physics, 2011, vol. 7, pp. 907-912.
Underwood et al., "Imaging Photon Lattice States by Scanning Defect Microscopy" Physical Review X, 2016, vol. 6, article 021044, pp. 1-9.
Owens et al., "Quarter-Flux Hofstadter Lattice in Qubit-Compatible Microwave Cavity Array" James Franck Institute and The University of Chicago, 2017, arXiv: 1708.01651v1, pp. 1-11.
Koch et al., "Time-reversal-symmetry breaking in circuit-QED-based photon lattices" Physical Review A, 2010, vol. 82, article 043811, pp. 1-18.
Underwood et al., "Low-disorder microwave cavity lattices for quantum simulation with photons" Physical Review A, 2012, vol. 86, article 023837, pp. 1-5.

\* cited by examiner

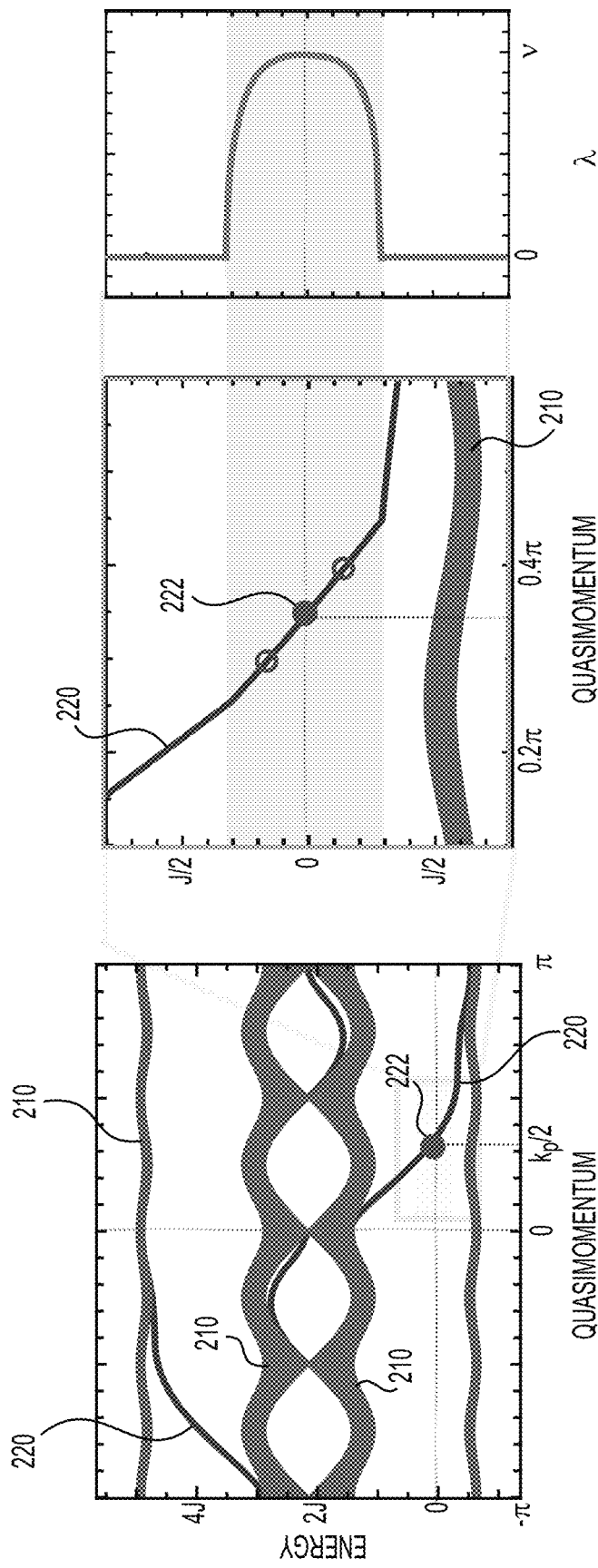

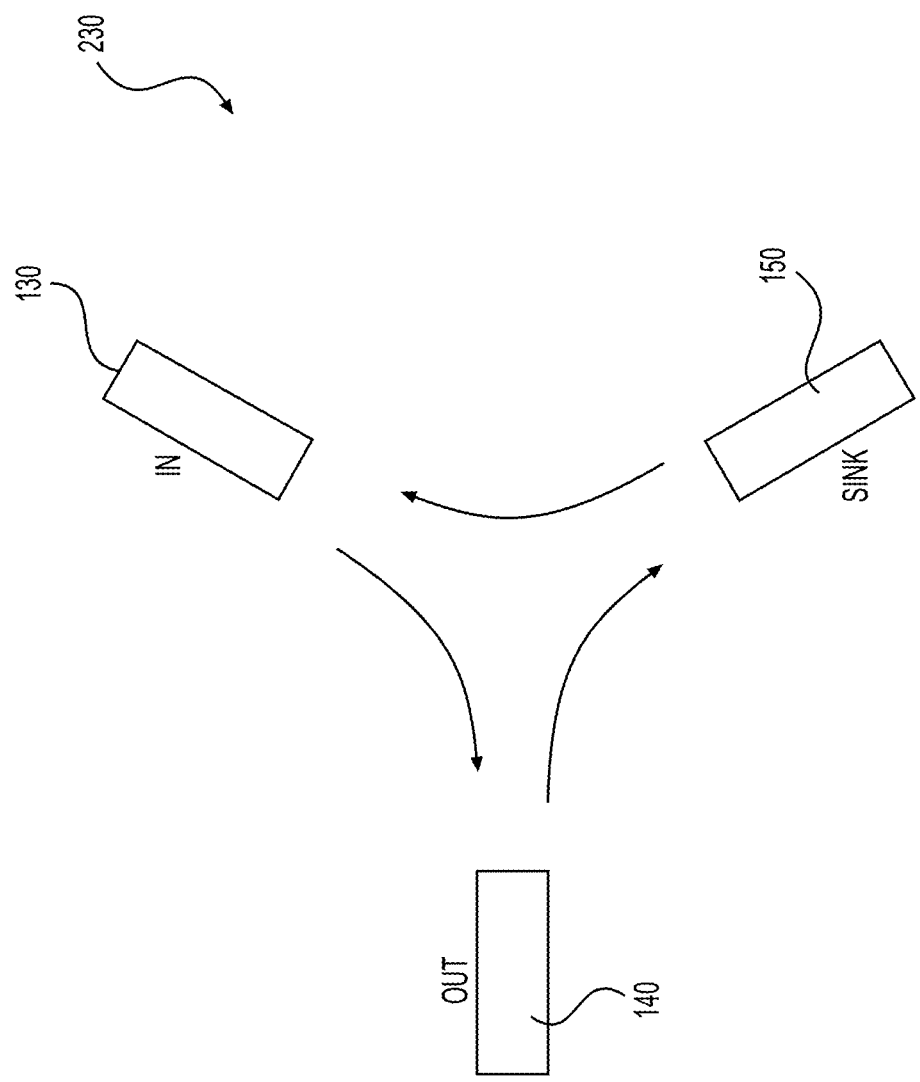

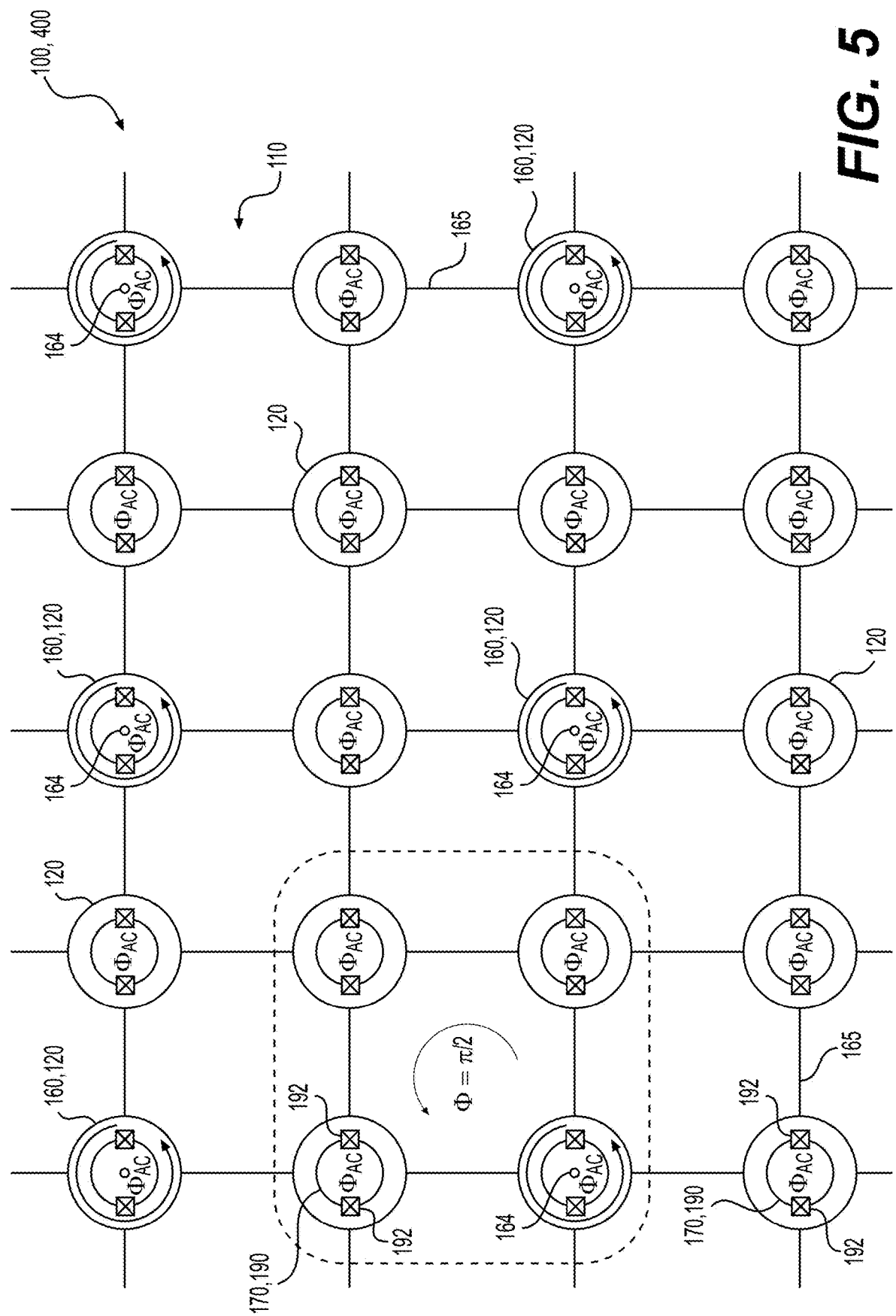

TOPOLOGICALLY-PROTECTED TRAVELING-WAVE AMPLIFIER

CROSS-REFERENCE

The present application claims priority to U.S. Provisional Application No. 62/384,086 filed on Sep. 6, 2016, and U.S. Provisional Application No. 62/467,528 filed on Mar. 6, 2017, the entirety of which are incorporated herein by reference.

FIELD

The present technology relates to topologically-protected amplifiers.

BACKGROUND

Amplifiers, ubiquitous building blocks in myriad applications, are at the simplest level characterized by two operational properties—bandwidth and gain—both of which are ideally large. In many standard designs based on resonant cavities or circuits, increasing either the gain or bandwidth necessarily comes with a sacrifice in the other quantity. It would however be highly desirable to obtain increased gain without unduly sacrificing the bandwidth. This naturally leads to extended structures (e.g. travelling wave amplifiers), whose large size makes them more susceptible to disorder and imperfections introduced during the fabrication of the amplifier. It is also desirable to have robust amplifiers that are minimally affected by such imperfections. Furthermore, in many sensitive applications, it would be desirable to have an amplifier be truly unidirectional, meaning that it strongly amplifies signals arriving from a source but prevent any transmission of signals or noise to the source (thus protecting a potentially fragile signal source). Amplifiers whose noise properties approach the fundamental limits set by quantum mechanics are also highly desirable in a variety of contexts, ranging from quantum information processing in circuits to radio astronomy and ultrasensitive force detection.

SUMMARY

It is an object of the present technology to ameliorate at least some of the inconveniences present in the prior art.

In accordance with one aspect of the present technology, a topologically-protected traveling-wave amplifier includes a plurality of resonators arranged in a two-dimensional array (TDA). The plurality of resonators is arranged to define a periphery including a first edge. Each resonator is coupled to neighboring resonators of the TDA. An input line is coupled to an input resonator of the plurality of resonators, the input resonator being disposed along the first edge. An output line is coupled to an output resonator of the plurality of resonators. The output resonator is disposed along the first edge and spaced from the input resonator by at least one other resonator of the plurality of resonators. A synthetic gauge field generator (SGFG) is associated with the plurality of resonators, the SGFG and the plurality of resonators being configured to provide a topologically-protected edge state for the TDA. The topologically-protected edge state corresponds to propagation along the periphery in a propagation direction from the input resonator along the first edge to the output resonator. A parametric driving element is coupled to the plurality of resonators. The parametric driving element is configured to create pairs of photons in the topologically protected edge state and thereby amplify a signal propagating along the first edge in the propagation direction, whereby an input signal incident from the input line on the input resonator propagates in the propagation direction along the first edge while being amplified and is detected at the output line as an amplified signal and a signal incident from the output line is attenuated before emerging at the input resonator.

According to another aspect of the present technology, a method of amplifying an input signal includes injecting the input signal at an input resonator of a TDA comprising a plurality of resonators defining a periphery including a first edge, the input resonator being disposed along the periphery. The input signal is propagated along the periphery from the input resonator to an output resonator disposed along the periphery. The input signal propagates along at least a portion of the first edge during its propagation along the periphery from the input resonator to the output resonator. The plurality of resonators is parametrically driven so as to amplify the input signal while propagating the signal along the at least one portion of the first edge and an amplified signal is detected at the output resonator.

In accordance with one aspect of the present technology, there is provided a topologically-protected traveling-wave amplifier having a plurality of resonators arranged in a two-dimensional array (TDA), the plurality of resonators being arranged to define a periphery including a first edge, each resonator being coupled to neighboring resonators of the TDA. An input line is coupled to an input resonator of the plurality of resonators, the input resonator being disposed along the periphery. An output line is coupled to an output resonator of the plurality of resonators, the output resonator being disposed along the periphery and being spaced from the input resonator by at least one other resonator of the plurality of resonators. A synthetic gauge field generator (SGFG) is associated with the plurality of resonators. The SGFG and the plurality of resonators are configured to provide a topologically-protected edge state for the TDA. The topologically-protected edge state corresponds to propagation along the periphery in a propagation direction from the input resonator along the first edge to the output resonator. A parametric driving element is coupled to the plurality of resonators, the parametric driving element being configured to create pairs of photons in the topologically protected edge state and thereby amplify a signal propagating along the first edge in the propagation direction. An input signal incident from the input line on the input resonator propagates in the propagation direction along the first edge while being amplified and is detected at the output line as an amplified signal. A signal incident from the output line is attenuated before emerging at the input resonator.

In some implementations, the input resonator is disposed along the first edge.

In some implementations, the output resonator is disposed along the first edge.

In some implementations, each of the plurality of resonators is an optical cavity and adapted to support clockwise and counter-clockwise propagating modes. At least a subset of the optical cavity resonators are fabricated from a nonlinear optical material. Each of the input line and the output line is an optical fiber. The SGFG includes a plurality of asymmetric waveguide loops coupling neighboring resonators such that propagation phases become direction-dependent. The parametric driving element includes a pump laser configured to emit pump photons, each pump photon incident on any resonator fabricated from the nonlinear optical material being down-converted to a pair of down-converted photons having a frequency and momentum corresponding to the at least one topologically protected edge state.

In some implementations, the optical cavity is an optical ring resonator.

In some implementations, the plurality of resonators is arranged to form a square lattice.

In some implementations, each of the plurality of resonators is a microwave cavity, and each of the input line and the output line is a microwave transmission line. The SGFG includes a ferrite particle coupled to at least one resonator in each plaquette of the TDA. The parametric driving element includes a plurality of superconducting quantum interference devices (SQUIDs) and a magnetic flux generator, each SQUID being coupled to a corresponding one of the plurality of resonators and adapted to produce photons having a frequency and momentum corresponding to the at least one topologically protected edge state when driven with a time-dependent magnetic flux generated by the magnetic flux generator.

In some implementations, each SQUID is formed of two Josephson junctions.

In some implementations, the plurality of resonators is arranged to form a square lattice, each plaquette thus having four resonators.

In some implementations, each of the plurality of resonators is a microwave-frequency transmission line resonator, and each of the input line and the output line is an electrical transmission line. The SGFG comprises a plurality of coupling SQUIDs, each coupling SQUID connecting together at least two resonators and being biased with a static magnetic field. The parametric driving element comprises a plurality of driving SQUIDs and a magnetic flux generator, each driving SQUID being coupled to a corresponding one of the resonators and being adapted to produce photons having a frequency and momentum corresponding to the at least one topologically protected edge state when driven with a time-dependent magnetic flux generated by the magnetic flux generator.

In some implementations, each driving SQUID is formed of two Josephson junctions.

In some implementations, the plurality of resonators is arranged to form a honeycomb lattice having triangular symmetry with a unit cell having three resonators, each unit cell having a corresponding coupling SQUID, each of the three resonators being coupled to an other of the three resonators via the corresponding coupling SQUID.

In some implementations, the parametric driving element is coupled to each one of the plurality of resonators of the TDA.

In some implementations, the parametric driving element is coupled to each one of the plurality of resonators along the first edge.

In some implementations, the parametric driving element is coupled to a subset of the plurality of resonators along the first edge.

In some implementations, the input line is impedance matched to the input resonator.

In some implementations, the output line is impedance matched to the output resonator.

In some implementations, the amplifier includes a sink line coupled to a sink resonator of the plurality of resonators, the sink resonator being other than the input resonator and the output resonator. The sink resonator is disposed along the periphery other than the first edge.

In some implementations, the sink line is impedance matched to the sink resonator such that a signal propagating to the sink resonator exits the amplifier via the sink waveguide.

In some implementations, the amplifier is configured as an isolator for isolating the input resonator from signals injected into the output resonator via the output line.

In some implementations, the input line is adapted to receive a qubit readout signal from a qubit and inject the qubit readout signal into the input resonator.

In accordance with another aspect of the present technology, there is provided a method of topologically-protected traveling-wave amplification which includes injecting an input signal at an input resonator of a TDA comprising a plurality of resonators defining a periphery including a first edge. The input resonator is disposed along the periphery. The input signal is propagated along the periphery from the input resonator to an output resonator disposed along the periphery. The input signal propagates along at least a portion of the first edge during its propagation along the periphery from the input resonator to the output resonator. At least a subset of the plurality of resonators along the first edge are parametrically driven so as to amplify the input signal while propagating along the at least one portion of the first edge. An amplified signal is detected at the output resonator.

The explanations provided above regarding the above terms take precedence over explanations of these terms that may be found in any one of the documents incorporated herein by reference.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects, and advantages of embodiments of the present technology will become apparent from the following description, the accompanying drawings, and the appended claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a better understanding of the present technology, as well as other aspects and further features thereof, reference is made to the following description which is to be used in conjunction with the accompanying drawings, where:

FIG. 2B is an illustration of a topological band structure for a semi-infinite TDA similar to the TDA of FIG. 1A and without any parametric driving;

FIG. 2C is a close-up of the band structure of FIG. 2B in the presence of parametric driving, showing the energy interval corresponding to unstable edge state excitations;

FIG. 2D shows the amplification rate associated with edge state excitations in the same energy interval as in FIG. 2C;

FIG. 3C is schematic illustration of a circulator geometry formed by the topological amplifier of FIG. 3A;

FIG. 5 is a schematic top plan view of a portion of a TDA in an amplifier in accordance with another implementation of the present technology in which each resonator is a microwave cavity;

DETAILED DESCRIPTION

The present description relates to a non-reciprocal topologically-protected traveling-wave amplifier that can be implemented in different kinds of systems in which topological effects can be produced.

The general configuration of the amplifier 100 will be described using FIGS. 1A to 1D.

Figure 1A:
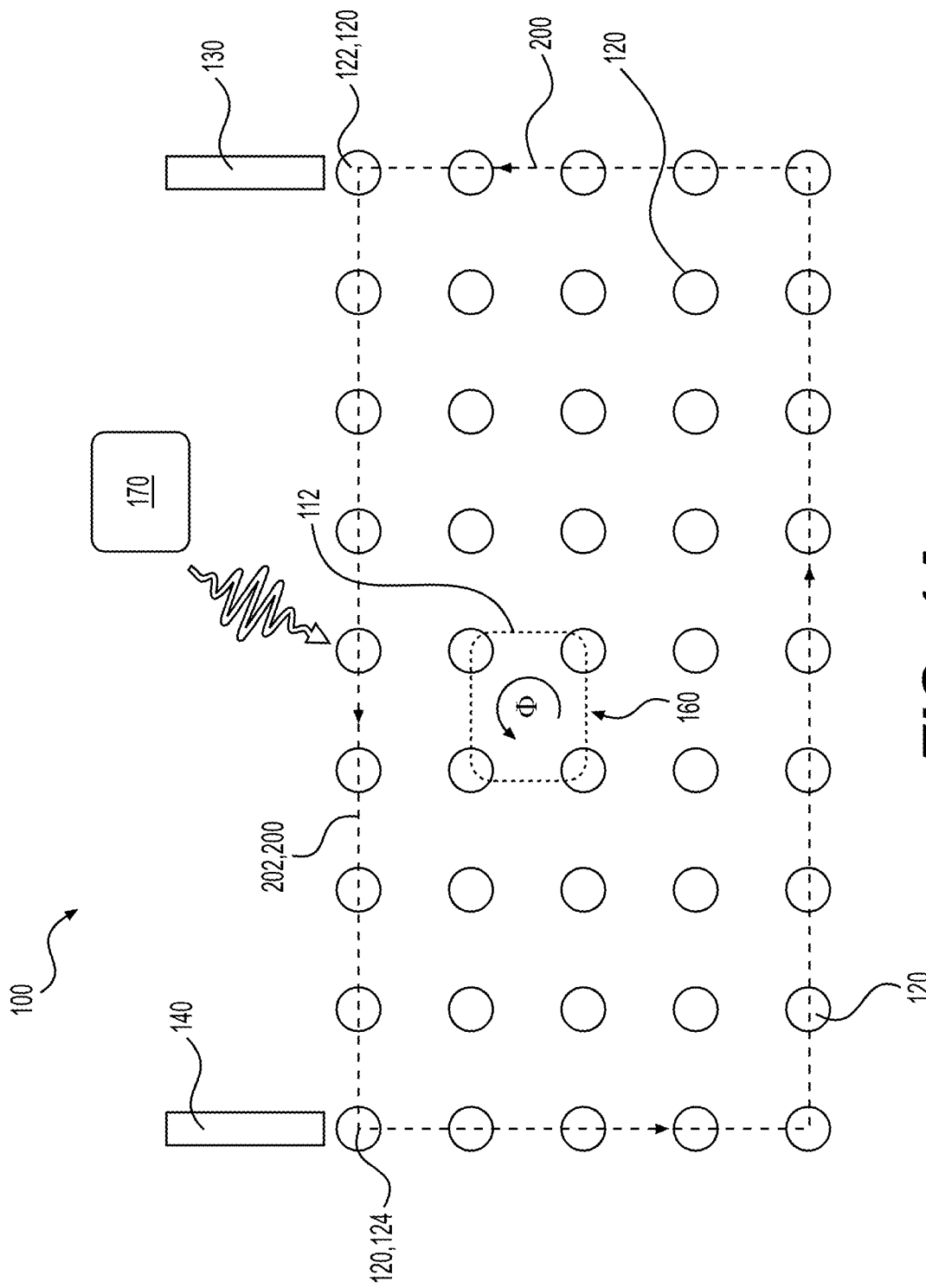
FIG. 1A is a top plan view of an example amplifier according to one implementation of the present technology.

With reference to FIG. 1A, the amplifier 100 comprises a two-dimensional array 110 of resonators 120, an input line 130 and an output line 140. Each resonator 120 is characterized by a resonant frequency. The resonant frequencies of all of the resonators 120 need not be identical for each resonator 120 in the TDA 110 but should lie within a range set by the size of the topological bandgap (as described below in further detail). The TDA 110 is further configured to produce a synthetic gauge field and at least some of the resonators 120 are configured to be parametrically driven. The amplifier 100 thus also includes a synthetic gauge field generator (SGFG) 160 and a parametric driving element 170 which combine in a finite geometry to produce topologically protected non-reciprocal amplification.

As can be seen in FIG. 1A, the resonators 120 are arranged in a periodic two-dimensional array (TDA) 110 and define a periphery 200 of the TDA 110 including an upper edge 202.

Figure 1B:
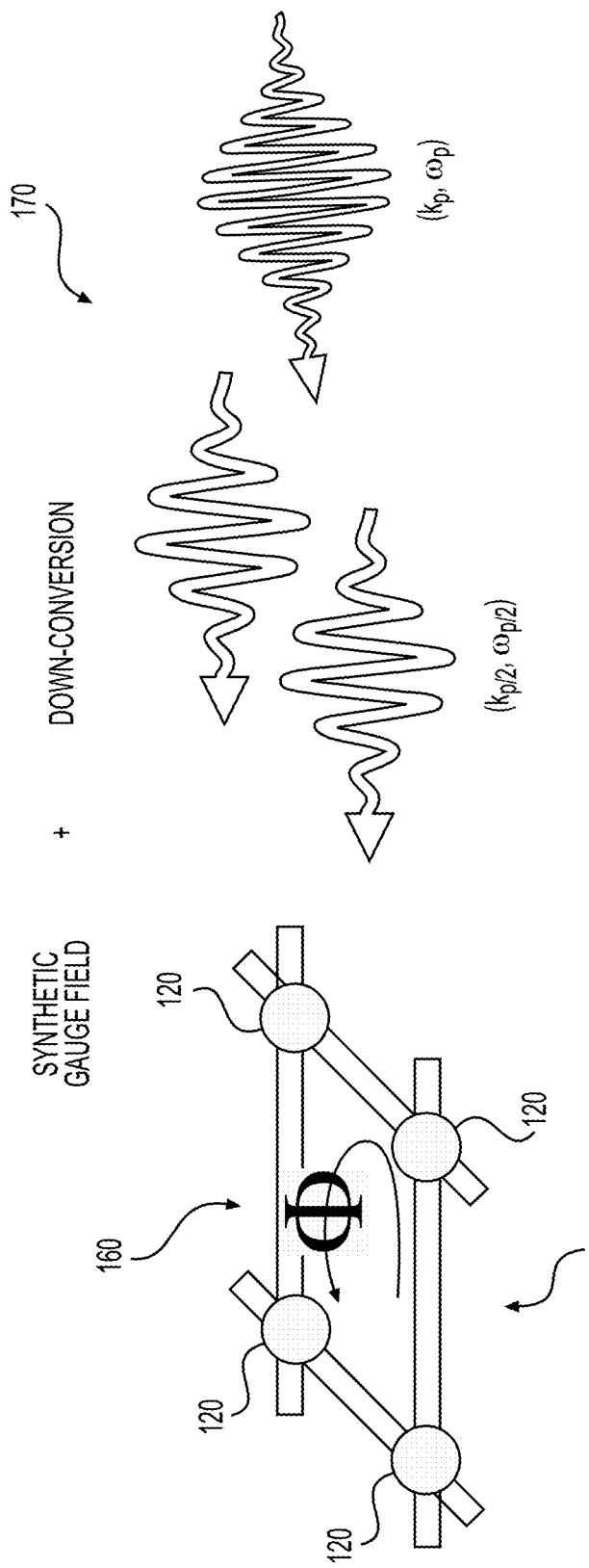
FIG. 1B is a schematic illustration of the physical principles underlying the amplifier of the present technology.

With reference to FIGS. 1A and 1B, the TDA 110 is associated with a synthetic plaquette flux (synthetic flux per plaquette) such that a photon acquires a plaquette phase $\Phi$ upon traveling around a plaquette 112 once. A plaquette 112 is generally defined as the smallest closed loop passing through adjacent coupled resonators 120 in the TDA 110. For example, in the square lattice TDA 110 of FIG. 1A, the plaquette 112 is the collection of four adjacent resonators 120 (forming a small square), as indicated in dashed lines labeled 112. The plaquette phase $\Phi$ acquired by the photon is analogous to the propagation phases acquired by charged particles in the presence of a magnetic field, and therefore the plaquette 112 is considered to be associated with a synthetic gauge field and a synthetic plaquette flux. The plaquette phase $\Phi$ is created by the synthetic gauge field generator (SGFG) 160 as will be described below, and gives rise to a topological band structure including topological band gaps and topologically protected edge states as will also be described below in detail with reference to FIGS. 2B to 2 D. The SGFG 160 is formed by one or more of the resonators 120 of the plaquette 112 and/or with the coupling between the resonators 120 which are configured to provide the synthetic flux and plaquette phase $\Phi$.

A signal having frequencies corresponding to an edge state of the topological band structure can propagate along the periphery 200 of the TDA 110, with the propagation being topologically protected and thereby not affected by disorder in the TDA 110, for example, disorder as a result of variations in the resonant frequency and/or other properties of the individual resonators 120 in the TDA 110.

With reference to FIGS. 1A and 1B, the parametric driving element 170 is configured to coherently adds pairs of photons to an edge state 220 (FIG. 2B) of the topological band structure. As will be described below, the parametric driving 170 can be tuned (by appropriate choice of frequency $\omega_p$ and wavevector $k_p$ of the pump field) such that a signal propagating along one of the edges (amplification edge) of the periphery 200 in a specific propagation direction is amplified while signals traveling along other edges of the periphery 200 are not amplified. The circulation direction of the edge state, i.e. the direction of propagation of the edge state 220 is determined by the sign of the synthetic gauge field and the direction of the wavevector $k_p$ of the pump field determines which edge of the periphery 200 is the amplification edge.

With reference to FIG. 1A, the input line 130 is coupled to an input resonator 122 disposed on the amplification edge 202 and used to inject an input signal to the amplifier 100. The output line 140 is coupled to an output resonator 124 disposed along the amplification edge of the TDA 110. The input and output lines 130, 140 are arranged such that a signal input to the system 100 via the input line 130 is amplified when traveling towards the output line 140 along the amplification edge 202 as shown schematically in FIG. 1C. The output line 140 is used to detect the amplified signal.

The amplification is non-reciprocal in that signals and noise traveling along the amplification edge 202 from the output resonator 124 towards the input resonator 122 are not amplified. In addition, signals traveling along other edges are not amplified.

Figure 1C:
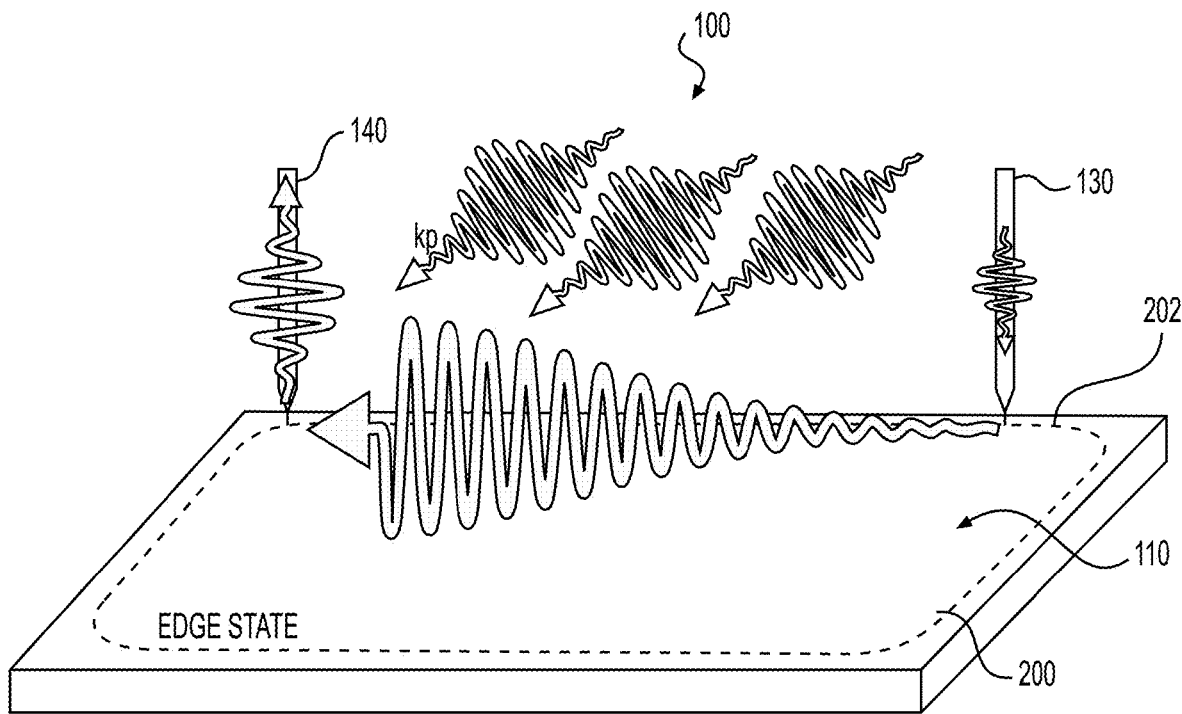
FIG. 1C is a schematic illustration of an edge state of the amplifier showing a signal injected via an input line propagating along a first edge of the amplifier towards an output line in a direction so as to be amplified.
Figure 1D:
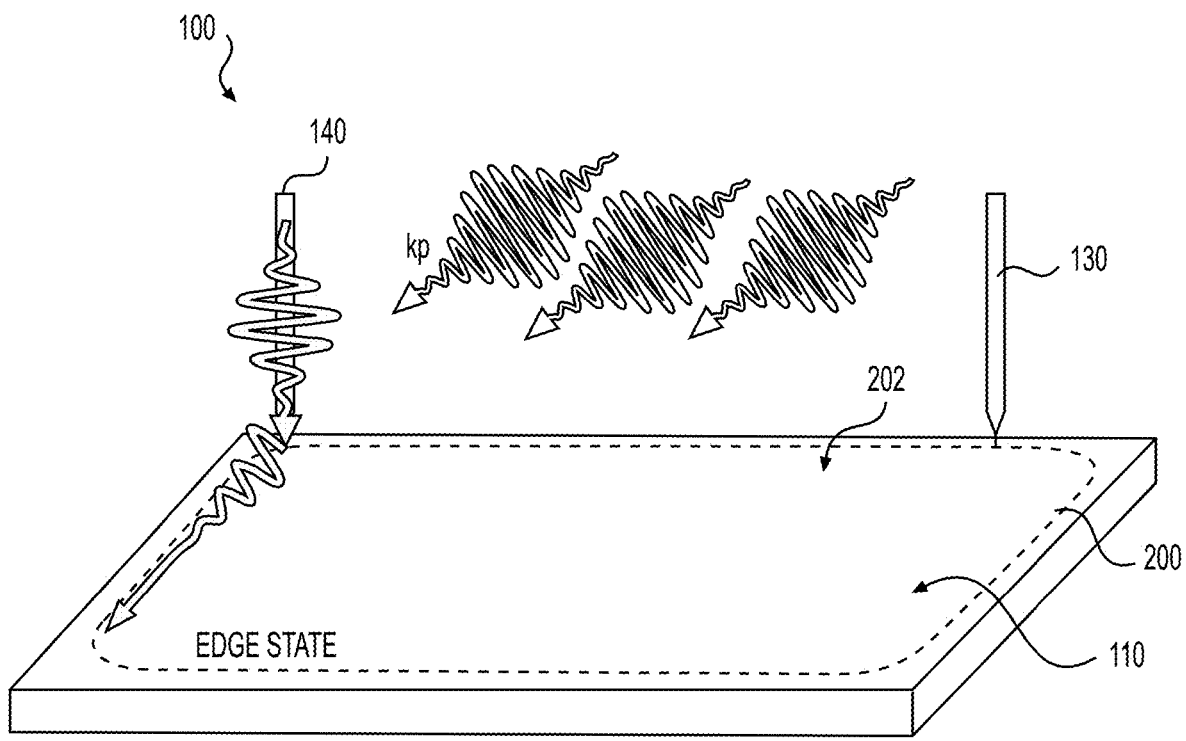
FIG. 1D is a schematic illustration of the amplifier of FIG. 1C showing the propagation of a signal injection injected therein via the output line, the signal propagating from the output line along a second edge of the amplifier without being amplified.

For example, in the illustrated implementation of FIGS. 1A, 1C and 1D, the amplification edge is the upper edge 202 of the TDA 110. An appropriate choice of frequency $\omega_p$ and wavevector $k_p$ for the pump field in the parametric driving element 170 causes a signal traveling leftwardly along the upper edge 202 of the TDA 110 to be amplified as can be seen in FIG. 1C while a signal traveling along the other edges of the TDA 110 is not amplified as shown in FIG. 1D. Thus, in the illustrated implementation, the input and output resonators 122, 124 are disposed along the upper edge 202 of the TDA 110 such that a signal input via the input line 130 is amplified when traveling leftwardly along the upper edge 202 towards the output resonator 124 where it is detected by the output line 140 as an amplified signal. It is also contemplated that one or both of the input and output resonators is not disposed along the upper edge 202 but elsewhere along the periphery 200 as long as in traveling from the input resonator 122 to the output resonator 124, the signal has to propagate along the upper edge 202 where amplification occurs.

Figure 3A:
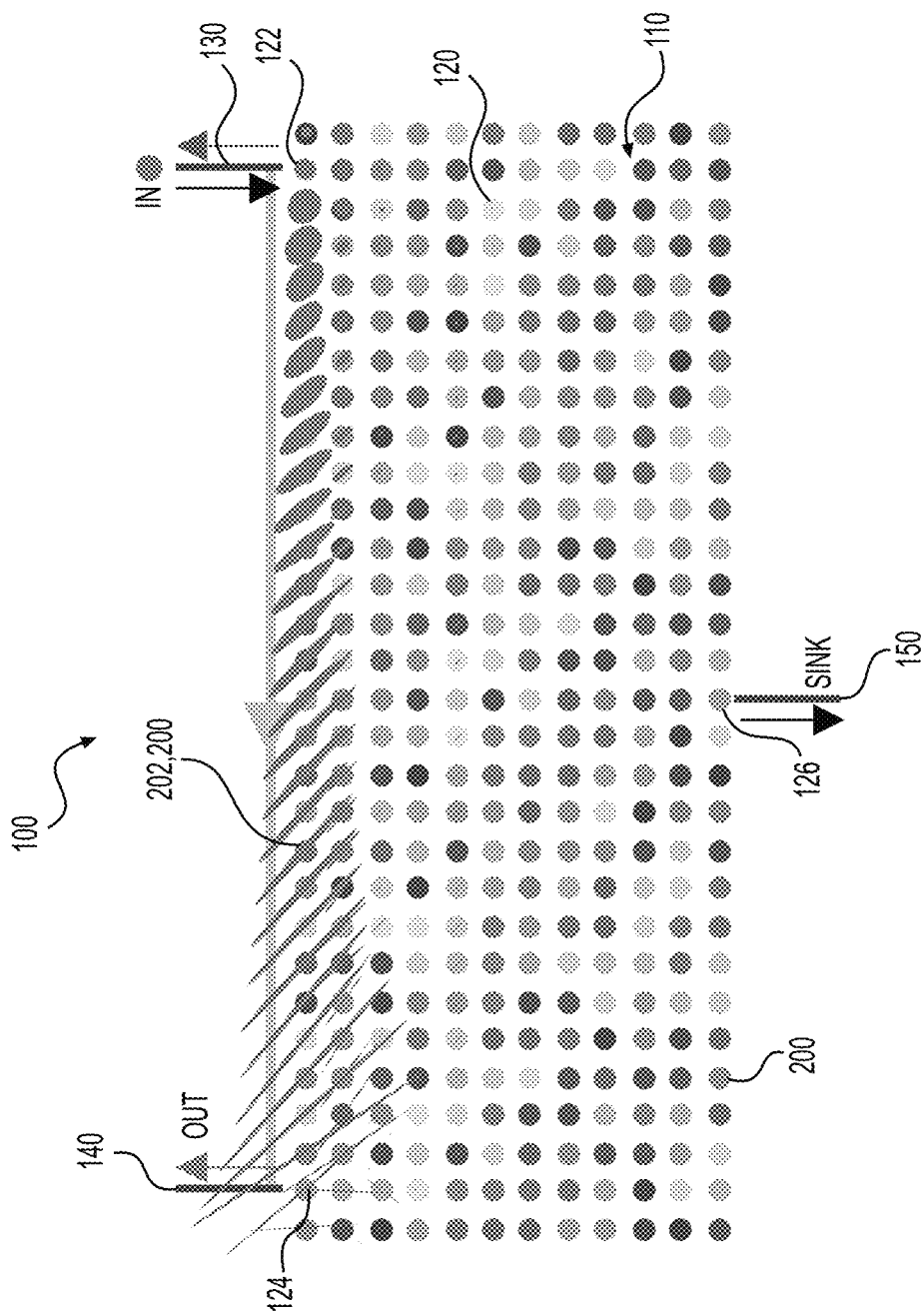
FIG. 3A is a schematic top plan view of a topological amplifier similar to that of FIG. 1A showing the linear response of the photonic amplitude at each resonator of the TDA for a signal injected at an input port and propagating towards the output port along an upper edge and being amplified thereby.
Figure 3B:
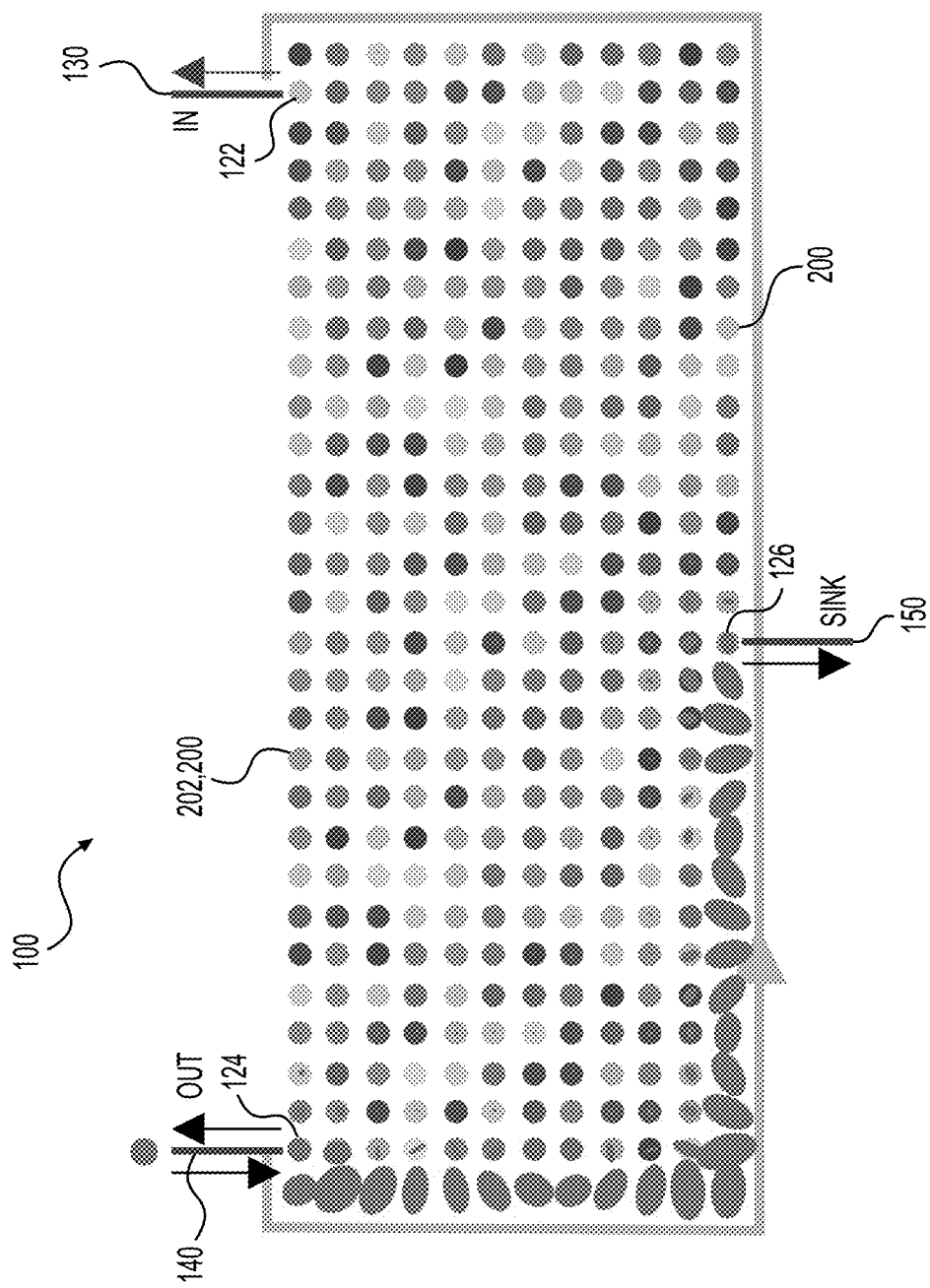
FIG. 3B is a plan view of the topological amplifier of FIG. 3A showing the linear response of the photonic amplitude at each resonator of the TDA for a signal injected at an output port and propagating towards the input port along a path other than the upper edge without amplification.

With reference to FIGS. 3A and 3B, in some implementations, a sink line 150 is coupled to a sink resonator 126 disposed along an edge of the TDA 110 other than the amplification edge. The sink waveguide 150 is used to remove any signals corresponding to the topological edge state and traveling from the output resonator 124 towards the input resonator 122 along an edge other than the amplification edge. In the illustrated implementation of FIG. 3A, the sink resonator 126 is disposed along a lower edge of the TDA 110. The addition of the sink line 150 makes the TDA 110 act like an isolator in the reverse direction of operation (i.e. for signal input via the output line 140).

It should be understood that each of the input line 130, output line 140 and the sink line 150 could be any structure that through which a signal can travel to and from a resonator 120. For example, a line 130, 140, 150 could be a waveguide or a transmission line.

Figure 7:
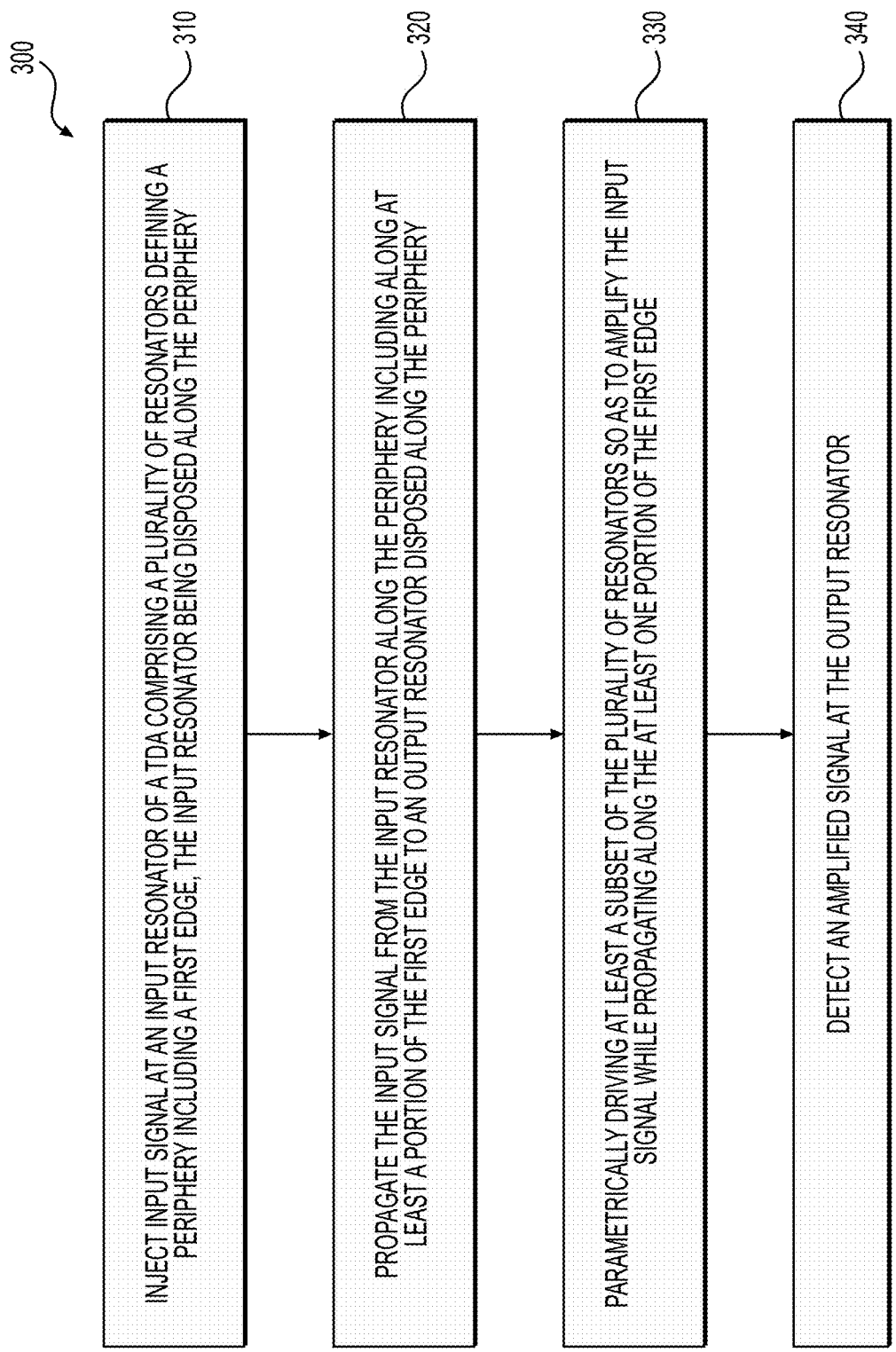
FIG. 7 is a flowchart of a method for amplifying an input signal in accordance with an implementation of the present technology.

With reference to FIG. 7, a method 300 of amplifying an input signal includes injecting 310 an input signal corresponding to a topologically protected edge state into the input resonator 122 of the TDA 110 and propagating 320 the input signal along the periphery of the TDA 110 towards the output resonator 124. The input and output resonators 122, 124 are both disposed along the periphery 200 of the TDA 110 such that the input signal propagates along at least a portion of the amplification edge (the upper edge 202 in the illustrated implementation) during its propagation along the periphery from the input resonator 122 to the output resonator 124. In the illustrated implementation, the input and output resonators 122, 124 are both disposed along the amplification edge. It is contemplated that only one of the input and output resonators 122, 124 could be disposed along the amplification edge. It is also contemplated that neither of the input or output resonator 122, 124 is disposed along the amplification edge but disposed such that the input signal has to propagate along the amplification edge in traveling from the input resonator 122 to the output resonator 124. The method 300 further includes parametrically driving 330 at least a subset of the plurality of resonators 120 so as to amplify the input signal during its propagating along the amplification edge and detecting 340 an amplified signal at the output resonator 124.

The amplifier 100 described above can be implemented in various systems. Example implementations 400, 500, 600 of the topologically-protected traveling-wave amplifier 100 will be described below in further detail.

Optical Implementation

The amplifier 100 can be implemented in an optical system 600 as will now be described with respect to FIGS. 2A to 4C.

Figure 2A:
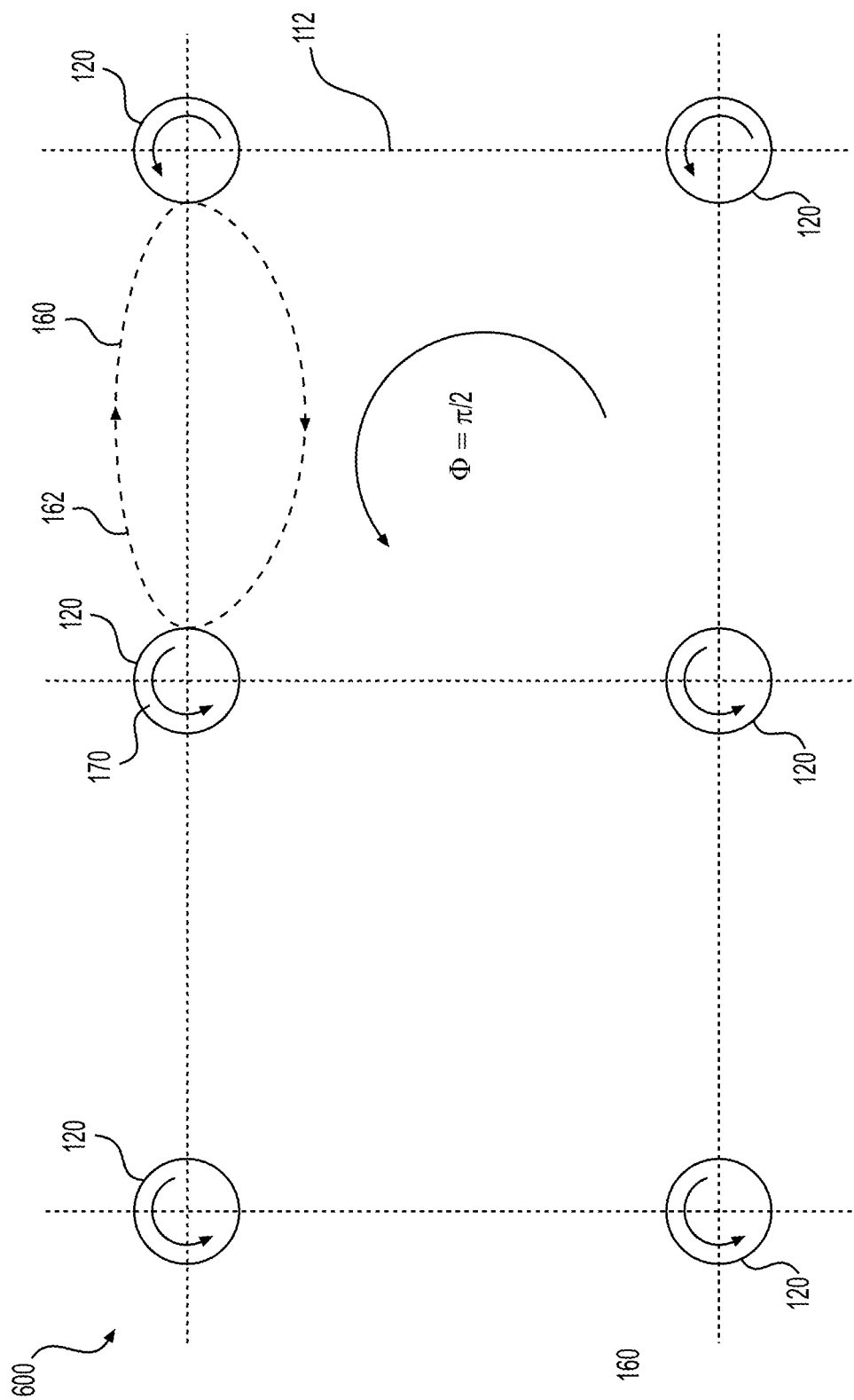
FIG. 2A is a schematic close-up top plan view of a portion of an example optical implementation of an amplifier including optical cavity resonators in a two-dimensional array (TDA) and showing the coupling via waveguide loops of the optical cavity resonators.

In the optical implementation 600, with reference to FIG. 2A, each resonator 120 is an optical cavity that can support a pair of degenerate of clockwise and counter-clockwise propagating modes. The resonators 120 could be in the form of any suitable optical resonators. For example, each resonator 120 could be an optical ring resonator or an optical disk resonator. The resonators 120 could be micro- or nano-resonators, such as micro- or nano-disk resonators or micro- or nano-ring resonators and could have any suitable configurations such as planar configurations, dual concentric ring configurations, racetrack configurations, micro-toroid, oval, disk, doughnut, and the like.

With reference to FIG. 2A, each resonator 120 is coupled to a neighboring resonator 120 in the TDA 110 by a coupling waveguide 162 in the shape of an asymmetric loop (shown schematically for one of the coupling waveguides 162). The length of a coupling waveguide 162 (or the index of refraction thereof) is selected such that photons interfere destructively in the waveguide loops 162 while interfering constructively in the resonator 120 so that the photons are confined within the resonators 120 rather than inside the coupling waveguides 160. The coupling waveguides 162 provide a path for photons to hop from one resonator 120 to another resonator 120. The hopping rate between nearest neighbours (i.e. the strength of the coupling between neighboring resonators 120) is represented symbolically by the parameter J.

The coupling waveguides 162 are configured to provide a synthetic gauge field. In the optical implementation, 600 the SGFG 160 thus comprises the coupling waveguides 162. The loops formed by the coupling waveguides 162 are asymmetric in that the upper and lower branches of the coupling waveguide 162 have different lengths (or different index of refraction) such that a photon hopping from one resonator 120 to another resonator 120 along the upper branch acquires a different phase than a photon traveling via the lower branch of the coupling waveguide 162. As a result, as shown schematically seen in FIG. 1A, a photon hopping in a counter-clockwise direction around a plaquette 112 acquires a non-zero plaquette phase $\Phi$ which can be interpreted as a synthetic gauge field flux. It is contemplated that the synthetic gauge field could be created by other means than as shown herein.

The presence of boundaries in a finite-size TDA 110 and a non-zero plaquette phase $\Phi$ created as a result of the synthetic gauge field lead to a topological band structure having edge states as will be described below in further detail with reference to FIGS. 2A to 2C. Topologically-protected propagation of light signals in two-dimensional resonator arrays has been described elsewhere, for example, in U.S. Pat. No. 9,052,448 issued on Jun. 9, 2015 (referred to hereinafter as Hafezi) the entirety of which is incorporated herein by reference.

The optical implementation 600 of the amplifier 100 includes a pump laser (not shown) for producing the pump photons. The pump laser could be implemented on chip, or it could be external to the main device chip and configured for illuminating the TDA 110 or part thereof. In the illustrated optical implementation 600, each resonator 120 is constructed of a non-linear optical material such that an incident pump photon having frequency $\omega_p$ and wavevector $k_p$ is down-converted to a pair of photons having frequency $\omega_p/2$ and wavevector $k_p/2$ as depicted schematically in FIG. 1B. An appropriate choice of pump photon frequency $\omega_p$ and wavevector $k_p$ can be used to excite the edge states in the topological band structure. The downconverted photon pairs provide the parametric driving in the system 600. The pump laser which is the source of the pump photons and ultimately the downconverted photons, along with the optically non-linear material used to fabricate each cavity, can thus be considered to be the parametric driving element 170 for the optical implementation 600 of the amplifier 100. The optical resonators 120 are fabricated using a $\chi^{(2)}$ non-linear optical material. The non-linear optical material could also be a $\chi^{(3)}$ material or higher order nonlinear material. The non-linear optical material could be a chalcogenide, lithium niobate, or any suitable material.

Band Structure

The topological band structure for an example amplifier 100 will now be described with reference to FIGS. 2A to 2D.

FIG. 2B shows the topological band structure for a semi-infinite two-dimensional strip TDA 110 having a square lattice symmetry with a plaquette phase $\Phi=\pi/2$ in the absence of parametric driving (for example, when the pump laser in the optical implementation 600 is switched off) and in the absence of disorder. The continuous bulk band structure consists of four bands 210 (one for each site in the magnetic unit cell). The top and bottom bands are flat Landau levels separated from the two central bands by topological band gaps. Due to the presence of the boundary in the semi-infinite strip, one finds inside each topological band gap an edge state 220 (dark blue line). The net number of edge states 220 (defined as the total number of edge states weighted by the sign of their slope) is a topologically protected quantity which does not depend on the shape of the periphery 200 of the TDA 110 and can be calculated from the bulk Hamiltonian as described in *Phys Rev. B*, Vol 14, pages 2239-2249, published in Sep. 1976, (hereinafter referred to as Hofstadter), the entirety of which is incorporated herein by reference.

In the presently illustrated implementation, there is only one edge state 220 in each band gap. The edge state 220 in the lower band gap corresponds to an edge state 220 in which a photon hops in a counter-clockwise direction around the edge 200 of the amplifier 100.

In the absence of parametric driving, a photon having frequency corresponding to the edge state 220 will hop around the edge 200 of the TDA 110 in a counter-clockwise direction. The photon will eventually be dissipated due to internal losses in the photonic cavity resonators 120.

In the presence of parametric driving (for example, in the optical implementation 600, when the parametric driving element 170 in the form of the laser pump is switched on), the resulting Hamiltonian for the system can exhibit instability depending on the tuning of the parametric driving. As an example, with reference to FIGS. 2B and 2C, focusing on the edge mode 220 in the lower topological band gap (having dispersion $\varepsilon_E(k)$), the solid green circle 222 indicates the tuning of the pump photon frequency $\omega_p$ and wavevector $k_p$ that can resonantly excite pairs of down-converted edge state photons with wavevector $k_p/2$. This tuning of the pump, combined with the constraints of energy and momentum conservation, places strong limits on what kinds of photons may be created. In particular, photons can only be created as edge state excitations of the original topological band structure (i.e. the band structure present in the absence of any parametric driving). For convenience, the energy E is counted off from half of the pump photon energy such that the edge state should have energy E=0 at the wavevector $k_p/2$.

If the above resonance condition is met (i.e., if the parametric driving element 170 is tuned so as to obtain down-converted photons with wavevector $k_p/2$ corresponding to the edge mode 220), an arbitrarily weak parametric driving amplitude v will cause instability of the edge mode 220. Because of the approximately linear dispersion relation $\varepsilon_E(k)$ of the edge mode 220, the above tuning guarantees that the parametric driving can resonantly create a pair of edge mode photons having momenta $k_p/2\pm\delta k$ (see the hollow circles in FIG. 2B). Thus, even for a weak parametric drive amplitude v, the edge state will exhibit instability (i.e. non-zero amplification rate) over a range of quasimomenta near $k_p/2$ (corresponding to a finite bandwidth around $\omega_p/2$ in the lab frame) as can be seen in FIG. 2C.

The above-described parametric driving tuned as shown in FIG. 2B creates excitations of the edge state 220. In this case, momentum and energy conservation are satisfied for propagation of a signal along the upper edge 202 of the TDA 110 implying an amplification of a signal propagating along the upper edge 202 within the operational bandwidth defined in part by the edge state 220.

FIG. 2C shows a close-up of the band structure around energy E=0 for a finite laser power. In the energy interval shaded in green corresponding to unstable edge state excitations, pairs of Bogoliubov excitations having quasimomenta $k_p/2\pm\delta k$ are also excited. FIG. 2D shows the corresponding amplification rate λ (x-axis) as a function of the mode energy (y-axis). A positive amplification rate corresponds to exponential growth of signals in time and thus amplification behaviour. As expected from energy and momentum conservation, amplification only occurs for the edge state portion of the bandstructure.

FIGS. 2B to 2D are calculated using parameters: $\omega_0=2.15J$ where J is amplitude of the nearest-neighbor hopping rate, $\Phi=\pi/2$, $k_p=2.2/\alpha$ (where α is the lattice constant, i.e. the distance between neighbouring resonators 120 in the TDA 110). In FIGS. 2C and 2D, the value used for the coherent two-particle driving amplitude v=0.08J.

As can be seen from FIGS. 2C and 2D, the bandwidth can be increased by increasing the nearest-neighbor hopping rate J. Such an increase could be achieved, for example, by reducing the spacing a between adjacent resonators 120 in the TDA 110 (thus increasing the tunneling rate between adjacent resonators 120). Increasing the nearest-neighbor hopping rate J also increases the maximum possible gain G since the gain G is controlled in part by the parametric drive amplitude v (see FIG. 2D), but one requires v<J to ensure that the parametric drive only excites the edge state modes.

In these FIGS. 2B to 2D, the band structure and the amplification shown is calculated analytically and for a semi-infinite TDA 110 having no disorder, i.e. each resonator 120 in the TDA 110 has a resonant frequency $\omega_j=\omega_0$.

The amplification characteristics of an amplifier 100 formed by a finite-sized TDA 110 of disordered optical cavity resonators 120 will now be described with reference to FIGS. 3A to 3E. FIGS. 3A to 3E show the results of numerical calculations for an example amplifier 100 as described below.

In the example amplifier 100 of FIGS. 3A and 3B, the TDA 110 is a 30×12 array of resonators 120 arranged in a square lattice and defining a periphery 200 having an upper edge 202. Although not shown, each resonator 120 is coupled to a neighboring resonator 120 by a coupling waveguide 160 so as to obtain a plaquette phase $\Phi=\pi/2$ for the TDA 110. The resonators 120 are coupled to each other so as to have a nearest neighbor hopping rate J.

In FIGS. 3A and 3B, the grey scale coloring for each resonator 120 represents random disorder in which each resonator 120 has a resonant frequency $\omega_j$ that is slightly offset from a frequency $\omega_0$ by $\delta\omega_j$ as represented by the grey scale. In the illustrated Figures, the numerical simulations for the disordered case are performed for offsets $\delta\omega_j$ which are random numbers in the interval $-0.1J<\delta\omega_j<0.1J$.

In addition, each resonator 120 is assumed to have an internal-loss decay rate $\kappa$.

The amplifier 100 additionally includes three lines 130, 140, 150, each in the form of an optical waveguide, hereinafter referred to as waveguides 130, 140, 150. Each waveguide 130, 140, 150 is coupled to a corresponding resonator 122, 124, 126 at the edge of the TDA 110 to form a corresponding port. The coupling of each waveguide 130, 140, 150 to the corresponding resonator 122, 124, 126 can be described using standard input/output theory where the coupling of the waveguide 130, 140, 150 to the corresponding one of the resonators 122, 124, 126 is characterized by a corresponding coupling rate. The role of the waveguides 130, 140, 150 is two-fold: they serve as amplifier input-output ports and also stabilize the dynamics of the amplifier 100 as will be discussed below. Details of the calculations can be found in Appendix I.

In the absence of parametric driving ($\nu=0$), and when the small internal loss decay rate $\kappa$ is neglected, the TDA 110 having the waveguides 130, 140, 150 as shown in FIGS. 3A and 3B can be considered to operate as an ideal circulator 230 (shown schematically in FIG. 3C) where a signal having frequency corresponding to a topological band gap and incident from any one of the waveguides 130, 140, 150 is entirely transmitted into the next one of the waveguides 130, 140, 150. Indeed, the impedances at each port can be matched to cancel the back-reflection by tuning the corresponding coupling rate between each waveguide 130, 140, 150 and the corresponding coupled resonator 122, 124, 126. Thus, a wave corresponding to a topological band gap and impinging from any one of the waveguides 130, 140, 150 onto the corresponding coupled resonator 122, 124, 126 of the TDA 110 will be entirely transmitted into the TDA 110. Once inside the TDA 110, a wave corresponding to a topological band gap has no alternative but to propagate unidirectionally along the periphery 200 of the TDA 110. In addition, the impedance matching ensures that a wave impinging on a waveguide 130, 140, 150 from the corresponding resonator 122, 124, 126 will be entirely transmitted into the waveguide 130, 140, 150. This circulator behaviour is topologically protected and persists even in the presence of disorder and imperfections in the TDA 110.

With reference to FIGS. 3A, 3B, 3D and 3E, in the presence of parametric driving ($\nu>0$), the TDA 110 having the waveguides 130, 140, 150 as shown in FIGS. 3A and 3B forms a topologically-protected and phase-sensitive amplifier 100. The parametric driving parameters selected are similar to those used in FIG. 2B to 2D. In the finite geometry TDA 110, the wavevector matching will be approximately realized only on the upper edge 202 of the TDA 110 for a wave propagating leftwardly. Thus, the upper edge 202 is the amplification edge and amplification occurs mainly in the region between the resonators 122, 124 coupled respectively to the waveguides 130, 140. Accordingly, the waveguide 130 coupled to the resonator 122 on the upper right corner of the upper edge 202 of the TDA 110 is used as an input port of the amplifier 100 (characterized by a corresponding coupling rate $\kappa_{in}$). The waveguide 140 coupled to the resonator 120 on the upper left corner of the upper edge 202 of the TDA 110 is used as an output port of the amplifier 100 (characterized by a corresponding coupling rate $\kappa_{out}$). The waveguide 150 coupled to the resonator 126 on the lower edge of the TDA 110 is used as a sink port of the amplifier 100 (characterized by a corresponding coupling rate $\kappa_{sink}$).

FIG. 3A shows the linear response of the photonic amplitude at each resonator 120 of the TDA 100 to a narrow-band signal whose frequency corresponds to an edge mode 220 and which is injected from the input waveguide 130 via the resonator 122 into the TDA 110. The signal injected into the TDA 110 from the input waveguide 130 propagates chirally until it leaves the TDA 110 through the output waveguide 140. Depending on its phase, the signal is amplified or de-amplified along the way. The red ellipses represent the linear response of the field inside the TDA 110 as a function of the incoming signal phase. As can be seen, the response is strongly phase sensitive—a signal with the phase appropriately matched to the phase of the parametric drive is amplified as it propagates along the upper edge 202 towards the resonator 124.

Figure 3E:
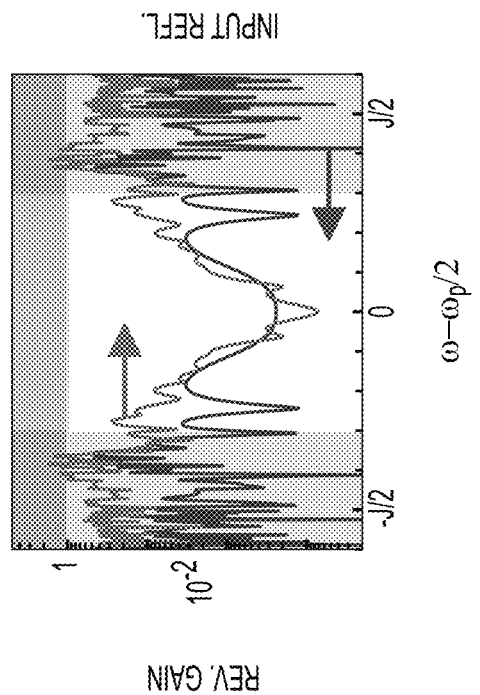
FIG. 3E is a graph of the reverse transmission (lower blue line) and the reflection coefficient (higher grey line) at the input port for the amplifier formed by a disordered sample.
Figure 3D:
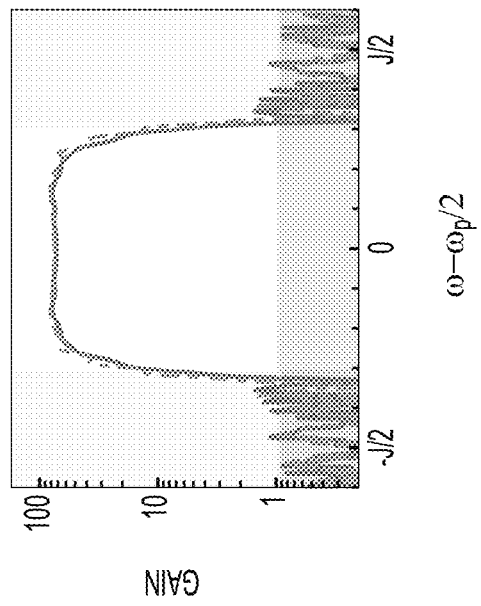
FIG. 3D is a graph of a transmission power gain as a function of the frequency of the input signal for an amplifier formed by a disordered sample (solid red line) and for an amplifier formed by a disorder-free sample (dashed grey line)

FIG. 3D shows the transmission power gain for the amplified quadrature as a function of the frequency of the input signal (counted from half of the pump photon frequency) for a disordered (solid red line) and a disorder-free sample (dashed grey line). As can be seen in FIG. 3D, treating the amplifier as a phase-sensitive amplifier, it is found that the power gain for the amplified signal quadrature is flat over a large bandwidth, corresponding to the frequency range over which the edge state dispersion is purely linear. The scale of this amplification bandwidth is approximately the nearest neighbor hopping rate J. It should also be noted that a power gain of about 100 can be realized for the parameters used in the example amplifier 100 of FIG. 3A.

Analytically, it has been found that the maximum power gain G can be described by the expression below:

$$G = \exp\left[\frac{2\nu L}{v_e}\right]$$

where $v_e$ is the edge state velocity and L is distance between the input and the output resonators 122, 124 and $\nu$ is the parametric driving amplitude. Note that the ratio L/α yields the number of resonators 120 lying between the input and output resonators 122, 124 along the upper edge 202 of the TDA 110.

Thus, we see that the gain is the exponential of the rate $2\nu$ of creation of down-converted photon pairs times the time of flight $L/v_e$ from the input resonator 122 to the output resonator 124. It has been noted based on the simulations and analytical calculations that the gain increases exponentially with the length L of the amplification edge (upper edge 202 in the illustrated implementation).

As discussed above, the amplifier 100 can be operated as a phase-sensitive amplifier. As will be realized readily by workers skilled in the art, such an amplifier 100 can also readily be operated in a phase-insensitive mode of amplification. See, for example, T. Roy et al, Appl. Phys. Lett. 107, 262601 (2015).

The non-reciprocal nature of the amplification will now be discussed with reference to FIGS. 3B and 3E.

FIG. 3B shows the response for a narrow-band signal whose frequency corresponds to an edge mode 220 (i.e. in the middle of the topological band gap) and which is injected from the output waveguide 140 via the resonator 124 into the TDA 110. The red ellipses represent the linear response of the field inside the TDA 110 as a function of the incoming signal phase. As can be seen from the relative shapes and sizes of the ellipses associated with each resonator 120, a signal injected into the TDA 110 via the output waveguide 140 propagates from the output resonator 124 toward the input resonator 122 following a different path along the periphery 200 (not along the upper edge 202) and it is not amplified. Moreover, an appropriate matching of the impedances at the sink port between the sink resonator 126 and the sink waveguide 150 ensures that the signal traveling to the sink resonator 126 from the output resonator 124 leaks out at the sink waveguide 150. Thus, any signals incident upon the TDA 110 via the output waveguide 140 will be almost entirely dumped into the sink waveguide 150, and not reach the input resonator 122. If a non-zero internal loss decay rate κ is included, the signal propagating from the output resonator 124 along the periphery 200 but not along the upper edge 202 could be attenuated before arriving at the resonator 126 depending on the amplitude of the internal loss decay rate κ. This device thus combines the functionality of an amplifier and an isolator in a single unified system.

FIG. 3E shows the reflection coefficient and the residual reverse gain at the input waveguide 130 for a signal injected into the TDA 110 via the output waveguide 130. As can be seen in FIG. 3E, the residual reverse gain and input reflection are much smaller than unity, which ensures the protection of a potentially fragile signal source (for example, a qubit) connected to the input port by waveguide 130. Thus, a potentially fragile source such as a qubit (not shown) connected to the input waveguide 130 is isolated from signals or noise incident at the output waveguide 140. The amplifier 100 thus also behaves as an isolator.

This strongly non-reciprocal amplifying behavior, as depicted in FIGS. 3A, 3B, 3D and 3E, is of topological origin and is thus robust against disorder. This resilience against disorder is demonstrated by including moderate levels of disorder in the simulations shown in FIGS. 3D and 3E.

Numerical simulations for FIGS. 3A, 3B, 3D and 3E were performed using parameters: $\omega_0$=2:14J, $\Phi$=π/2, ν=0:08J, $k_p$=2.2/α, κ=0:001J, $\kappa_{in}$=2:6J, $\kappa_{out}$=3J and $\kappa_{sink}$=4:2J. For the disordered simulations, the offset energies $\delta\omega_j$ represented by the greyscale in FIGS. 3A and 3B are random numbers in the interval $-0.1J<\delta\omega_j<0.1J$.

The numerical results of FIGS. 3A to 3E are in qualitative agreement with analytical results for a model in which a 1-dimensional chiral edge state is coupled to three waveguides. Details of the analytical calculations can be found Appendix I.

It should be understood that when a signal corresponding to one of the bulk bands is incident on one of the waveguides, 130, 140, 150, the signal is transmitted into the TDA 110 where it can propagate along paths not confined to the periphery 200. Signals propagating between the resonators 120 in the bulk (resonators 120 not along the periphery 200) are not amplified by the parametric driving. Such signals would eventually be attenuated due to internal losses within the resonators 120.

Waveguides and Impedance Matching

As mentioned above, the waveguides 130, 140, 150 serve to provide stability to the amplifier 100 in addition to serving as input and output ports for transmitting signals to and from the amplifier 100.

In a TDA 110 such as that of FIGS. 1A and 3A but having only one waveguide, for example the waveguide 130, when a signal input from the waveguide 130 propagates around the periphery 200 and arrives at the edge resonator 122 coupled to the waveguide 130 after one full first traversal of the periphery 200, the signal would have experienced a power gain G given by $$G = \exp\left[\frac{2vL}{v_e}\right]$$

The amplified signal would then be partially transmitted into the waveguide 130 and out of the TDA 110. The remaining part of the amplified signal would remain in the TDA 110 and be re-propagated along the periphery 200 for a second traversal therealong. The amplifier 100 is stable if the signal remaining in the TDA 110, at the start of the second traversal, is smaller than the signal at the start of the first traversal around the periphery 200.

In the absence of internal losses within the resonators 120, this stability condition could not be achieved without the presence of the waveguide 130. In addition, in order to prevent instability, the transmission T into the waveguide 130 from the edge resonator 122 should be large enough so that the signal propagating along the periphery 200 does not grow with each traversal around the periphery.

In an ideal case, when the waveguide 130 is perfectly impedance matched, all of the signal is transmitted into the waveguide 130 after the first traversal around the periphery 200. Impedance matching of the waveguide 130 prevents multiple traversals around the periphery 200 thereby precluding instability, and also prevents the formation of standing wave resonances and a strongly frequency dependent gain.

Analytically, it has been found that the impedance matching condition can be achieved by having $$\kappa_{coupling} = \frac{4v_e}{|u(j_\perp = 1)|^2} \equiv \kappa_{id}$$

where, $\mu(j_\perp=1)$ is the transverse edge state wavefunction evaluated at the edge and $v_e$ is the edge state velocity.

When the waveguide 130 is not perfectly impedance matched, stability can be achieved by ensuring that there is no net gain of the signal at the beginning of a second traversal around the periphery 200 after the first full traversal around the periphery. Considering the scenario where all three impedance mismatches are the same and writing $\kappa_{coupling}/\kappa_{id}=1+\epsilon$ $$\left(\frac{\epsilon}{2}+\epsilon\right)^3 < \frac{1}{\sqrt{G}}$$

The above condition implies that for a gain of roughly 20 dB, impedance mismatches of roughly ±15% do not lead to instabilities.

For gains greater than 20 dB, the amplifier 100 can be stabilized by providing appropriate sink waveguides 150. For example, the amplifier 100 could have two or more impedance-matched sink waveguides 150. In this case, the gain at the end of each traversal around the periphery 200 would decrease exponentially with the number of waveguides.

Thus, the lack of perfect impedance matching would not set any fundamental limits on the achievable gain for the amplifier 100.

Quantum-Limited Amplification

The amplifier 100 as described above also offers resilience to intrinsic losses. Even with such losses and their accompanying noise, the total added noise of the amplifier can approach the fundamental quantum limit value. This will now be described using FIGS. 4A to 4C.

The added noise spectral density of the amplifier as used herein is defined in the standard manner (see for example, A. A. Clerk et al. *Reviews of Modern Physics*, 82, 1155 (2010)). The frequency-resolved power spectral density of the total noise in the amplifier output quadrature of the field exiting the output resonator 124 is first considered. For each frequency, this total noise quantity is then divided by the amplifier power gain at that frequency, before subtracting therefrom the contribution from quantum vacuum fluctuations incident from the input waveguide 130 to obtain the added noise. The resulting added noise quantity describes the noise added by the amplification process, further details are given in Appendix I of U.S. Provisional Application No. 62/467,528 filed on Mar. 6, 2017, the entirety of which is incorporated herein by reference. The fundamental quantum limit for this added noise spectral density in a phase-sensitive amplifier is zero: at the quantum limit, the amplifier adds no noise, and the only noise exiting the amplifier 100 via the output line 140 corresponds to the amplified vacuum fluctuations that entered the device through the input line 130.

Figure 4A:
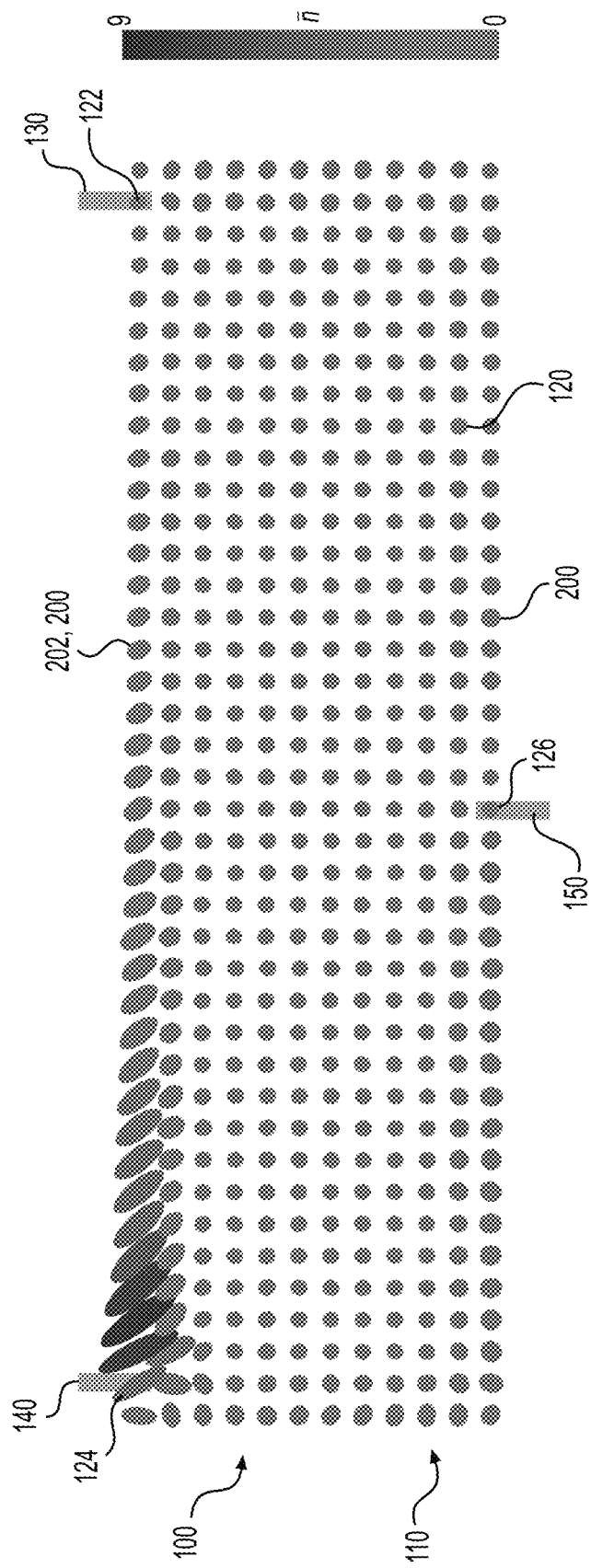
FIG. 4A is a schematic representation of the steady state noise at each resonator in the TDA of an example amplifier similar to that of FIGS. 3A and 3B.

FIG. 4A shows the stationary state for each resonator 120 in an example amplifier 100 comprising resonators 120 arranged in 40×12 TDA 110 for the situation where there is only vaccuum noise entering from each waveguide 130, 140, 150. The resulting stationary state of each resonator 120 is Gaussian, and can be represented by a Wigner function; these are visualized as a set of noise ellipses in FIG. 4A. In the bulk, the ellipses associated with each resonator 120 have a circular shape and their area is small as allowed by the Heisenberg uncertainty principle, representing a standard vaccuum state. In contrast, the ellipses associated with the resonators 120 along the upper edge 202 are anisotropic and have areas larger than the minimum required by the uncertainty principle, implying that the presence of a thermal squeezed state. This excess noise does not come from a finite temperature of the environment but rather from the amplification of zero-point fluctuations, also referred to in the art as quantum heating. In FIG. 4A, the color code represents the average number of photons at each resonator 120.

Figure 4C:
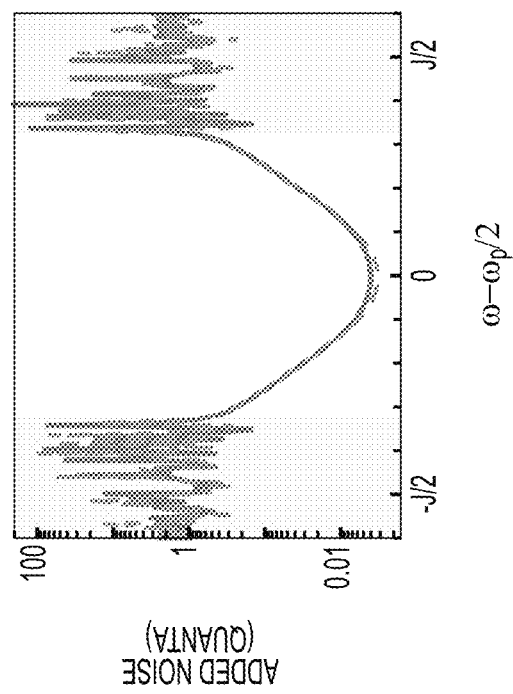
FIG. 4C is a graph of the added noise of the amplifier of FIG. 4A formed by a disordered sample (solid red line) and a disorder-free sample (dashed grey line)
Figure 4B:
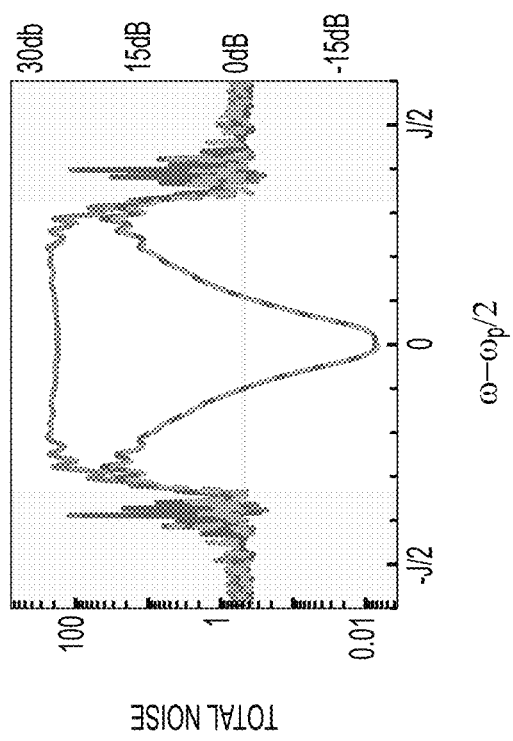
FIG. 4B is a graph of the total noise spectral density of the amplified quadrature and the squeezed quadrature of the field leaving the output waveguide in the amplifier of FIG. 4A plotted in units of quanta (left hand axis) and in decibels (right hand axis), showing the total noise spectral density of the amplified quadrature in a disordered sample (solid red line), the total noise spectral density of the amplified quadrature in a disorder-free sample (dashed grey line), the total noise spectral density of the squeezed quadrature for a disordered sample (solid blue line) and the total noise spectral density of the squeezed quadrature for a disorder-free sample (dashed green line)

FIG. 4B shows the total noise in the amplified quadrature plotted as a function of frequency for a disorder-free amplifier 100 (in grey dashed line) and for a disordered amplifier 100 (in solid red). FIG. 4B also shows the total noise in the squeezed quadrature plotted as a function of frequency for a disorder-free sample (dashed green line) and for a disordered sample (in solid blue). The total noise is plotted in units of quanta (left hand axis) as well as decibels (right hand axis). As can be seen, the noise in the amplified quadrature is only slightly larger than the standard quantum limit value for a phase preserving amplifier (i.e. the amplified vacuum noise entering from the input port 122).

FIG. 4C shows the added noise (as defined above and expressed as an equivalent number of input quanta) for a disorder-free amplifier 100 (in grey dashed line) and for a disordered amplifier 100 (in solid red). As can be seen, despite disorder and noise associated with internal loss, the amplifier 100 is nearly quantum limited over the entire amplification bandwidth (i.e. its added noise approaches the fundamental quantum limit of zero added noise quanta).

The simulations of FIGS. 4A to 4C are performed using the following parameters: 40×12 sites, $\omega_0=2:14J$, $\Phi=\pi/2$, $v=0:08J$, $k_p=2.2/\alpha$, $\kappa=0:001J$, $\kappa_{in}=2:6J$, $\kappa_{out}=3J$ and $\kappa_{sink}=4:2J$. For the disordered simulations, the offset energies $\delta\omega_j$ are random numbers in the interval $-0:1J<\delta\omega_j<0:1J$. For all plots, there is only vacuum noise entering the amplifier 100 (from the waveguides 130, 140, 150, and from the internal loss sources).

As can be seen, for frequencies within the amplification bandwidth, the frequency-resolved output noise is strongly squeezed below the vacuum level. Remarkably, the quality of the output squeezing is not deteriorated in the presence of disorder. As can be seen in FIG. 4B, for the parameters considered here, more than 15 dB of output squeezing are predicted both in the case of a disorder-free and a disordered sample (see the solid blue and dashed green curves in FIG. 4B).

It has been found, based on the numerical simulations and analytical calculations that the added nose remains constant as a function of the length L of the amplification edge (upper edge 202 in the illustrated implementation).

It is contemplated that, due to the quantum-limited noise properties of the amplifier 100, the amplifier 100 could be incorporated in circuits including qubits for quantum computation for performing measurements thereof without contributing to the overall noise in the circuit.

In the illustrated implementation of FIG. 1A, the TDA 110 is rectangular and has a rectangular periphery. The TDA 110 could be rectangular or square and have a minimum dimension of at least N×M where N and M are integers large enough to prevent tunneling between edges. For example, N and M could both be five. It is also contemplated that the periphery 200 could have any shape other than rectangular or square as long as the energy and wavevector matching can be satisfied along one of the edges of the TDA 110 in order to obtain amplification as described above.

In the example optical implementation 600 described above, all of the resonators 120 of the TDA 110 are coupled to the parametric driving element 170 as the laser pump is configured to emit pump photons onto the entire TDA 110 and the parametric driving is therefore experienced by each of the resonators 120 of the TDA 110. It is however contemplated that the parametric driving element 170 could be coupled only to some of the resonators 120 in the TDA 110. For example, only a subset of the resonators 120 on the upper edge 202 could be coupled to the parametric driving element 170 instead of each one of the resonators 120 as in the illustrated implementation.

Implementations where input and output waveguides couple to more than a single adjacent resonator 120 are also contemplated, and the coupling strength would be appropriately modified to ensure impedance matching.

Although the above discussion of band structure, edge states, noise and amplification characteristics has been provided in the context of an optical implementation 600 of an amplifier 100 having a TDA 110 comprising optical resonators 120 in a square lattice, the above discussion applies generally to other implementations of the amplifier 100, for example, the microwave cavity amplifier 400 described below, the microwave transmission line amplifier 500 described below, and the like. Thus, the TDA 110 could be formed of resonators 120 other than optical cavity resonators 120 as shown in FIG. 2A.

In the illustrated implementations of FIGS. 1A to 4C, the resonators 120 are arranged in a square lattice. It is however contemplated that the repeating pattern of the TDA 110 could be square, rectangular, triangular, hexagonal, rhombic or any other suitable two-dimensional shape. For example FIG. 6 (discussed in further detail below) shows an implementation 500 of an amplifier 100 having resonators arranged in a regular honeycomb lattice having triangular symmetry. The specific band structure and edge states would depend on the particular geometry and configuration of the TDA 110 in each implementation of the amplifier 100, whether it is an optical implementation 600, a microwave cavity implementation 400, a microwave transmission line implementation 500, or the like.

Microwave Cavity Amplifier

With reference to FIG. 5, the amplifier 100 can also be implemented using a microwave cavity system 400 in which each resonator 120 is a microwave cavity. In the illustrated implementation 400, the resonators 120 are arranged in a periodic two-dimensional square lattice to form the TDA 110. The plaquette 112 in this implementation thus comprises four resonators 120. The plaquette flux in this implementation is created by a synthetic gauge field generator 160 in the form of a ferrite particle 164 within one resonator 120 in each plaquette 112 as shown schematically in FIG. 5. Thus, in a microwave cavity TDA 110 having a square lattice with four cells in each plaquette 112, one out of every four resonators 120 would contain a ferrite particle 164. Microwave cavity TDAs 110 of this type give rise to a topological band structure including band gaps between bulk energy bands, and in a finite geometry, edge states in the band gaps as described above for the optical implementation 600 of the amplifier 100.

In the illustrated implementation 400, the microwave cavity resonators 120 are coupled to each other by a channel 165 directly milled between two neighboring cavity resonators 120. In some implementations, the microwave cavity resonators 120 are coupled to one another by capacitors.

In the illustrated implementation 400 of FIG. 5, the TDA 110 of microwave cavity resonators 120 is configured to have a synthetic plaquette phase $\Phi=\pi/2$, the band structure of FIGS. 2B to 2C being thereby applicable to the implementation 400 of the amplifier 100. Various possible architectures of microwave cavity TDAs 110 and their resultant topological band structures are described in further detail in the references Brandon M. Anderson et al., arXiv: 1605.03177v1 published on May 10, 2016 (referred to hereinafter as Anderson I); Brandon M. Anderson et al., Phys. Rev. X 6, 041043 (2016) (referred to hereinafter as Anderson II); and in Clai Owens et al., arXiv:1708.01651v1 published on Aug. 4, 2017 (referred to hereinafter as Owens), the entirety of which are incorporated herein by reference. Alternative examples can be found in D. L. Underwood et al., Phys. Rev. A 86, 023837 (2012) and D. L. Underwood et al., Phys. Rev. X 6, 021044 (2016), the entirety of which are also incorporated herein by reference.

In the microwave cavity amplifier 100 of FIG. 5, a superconducting quantum interference device (SQUID) 190, formed by two Josephson junctions 192, is coupled to each resonator 120. The SQUID 190 produces a pair of photons when driven by a time-dependent magnetic flux (a phenomenon refered to as "flux-pumping", details of which are described, for example, in T. Yamamoto et al, Appl. Phys. Lett. 93, 042510 (2016) and J. Y. Mutus et al, Appl. Phys. Lett. 103, 122602 (2013). Thus, the amplifier 400 includes a magnetic flux generator (formed e.g. by a current carrying wire, not shown) for creating a magnetic flux associated with each SQUID 190. The parametric driving element 170 in this implementation of the amplifier 100 is thus formed of the plurality of SQUIDs 190 associated with the plurality of resonators 120 and the magnetic flux generator. As in the optical implementation 600 of the amplifier 100, the frequency of the time dependent magnetic flux is selected so as to produce two microwave photons having an energy and momentum which can excite a desired edge state in this implementation 400 of the amplifier 100 and to cause amplification of a signal corresponding to that edge state.

It is further contemplated that the microwave cavity amplifier 400, 100 could be realized in a TDA 110 having a symmetry other than square. For example, the resonators 120 could form a triangular or a hexagonal lattice. The symmetry would produce a corresponding topological band structure having edge states corresponding to the particular lattice symmetry and geometry. A parametric driving element 170 in the form of a SQUID coupled to each resonator 120 could similarly produce topologically protected quantum limited amplification in an edge state based on the selected frequency for the time-dependent magnetic flux driving the SQUID 170.

It is further contemplated that only some of the resonators 120 of the TDA 110 could have a SQUID 190 coupled thereto. For example, it is contemplated that only a subset of resonators 120 along the edge where amplification is desired could have a corresponding SQUID 190 coupled thereto.

In this microwave cavity implementation 400 of the amplifier 100, each of the input, output and sink lines 130, 140, 150 (not shown in FIG. 5) is a microwave transmission line. As in the optical implementation 600 of the amplifier 100 discussed above, the input and output lines 130, 140, 150 are each coupled to a microwave cavity resonator 120 along the periphery 200 to form an input and output port such that a wave traveling leftwardly from the input resonator 122 to the output resonator 124 is amplified. The sink line 150 is coupled to a microwave cavity resonator 126 along an edge other than the edge having the input and output resonators 120 so that a wave traveling from the output resonator 120 towards the input resonator 120 exits the TDA 110 before it reaches the input resonator 120.

Microwave Transmission Line Amplifier

Figure 6:
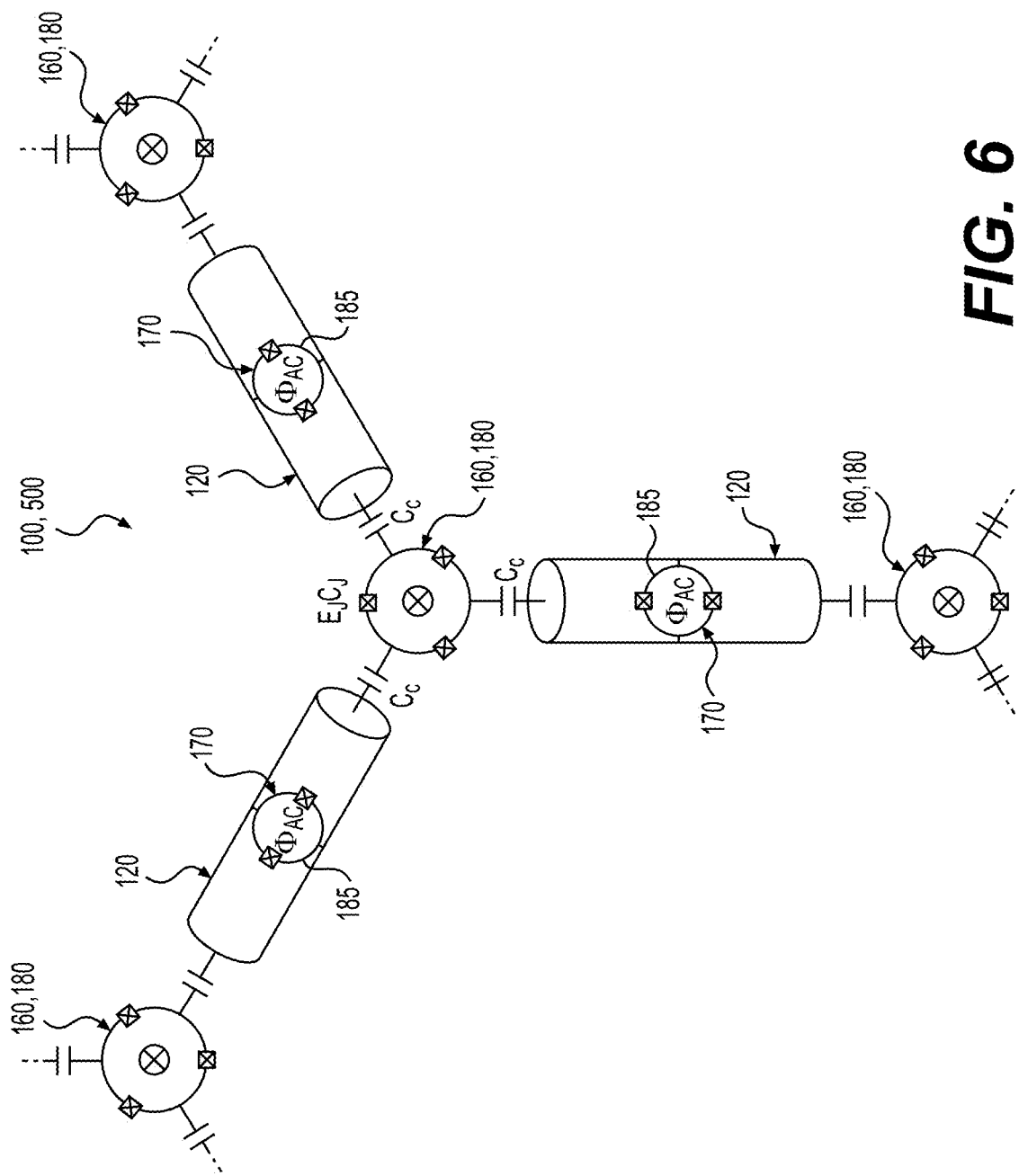
FIG. 6 is a schematic top plan view of a portion of a TDA in an amplifier in accordance with yet another implementation of the present technology in which each resonator is a microwave frequency transmission line.

A third implementation 500 of the amplifier 100 will now be discussed with reference to FIG. 6.

In this implementation 500, the resonators 120 are superconducting microwave resonators, for example, in the form of a coplanar microwave waveguide resonator or a microwave transmission line resonator. As can be seen in FIG. 6, the microwave transmission line resonators 120 are arranged to form a honeycomb lattice having triangular symmetry, each unit cell having three resonators 120. Thus, the TDA 110 formed by the microwave transmission line resonators 120 has triangular symmetry wherein each end of each microwave transmission line resonator 120 (except the microwave transmission line resonators 120 disposed along the edges of the TDA 110) is capacitively coupled to a SQUID 180 which is connected to a respective end of two other microwave transmission line resonators 120. Each coupling SQUID 180 is interrupted by three Josephson junctions (not indicated but shown), each Josephson junction being inserted between two of the three waveguide resonators 120. The coupling SQUID 180 can be threaded by a magnetic flux which creates the required plaquette phase Φ (flux per plaquette) for this implementation 500 of the amplifier 100. The magnetic flux could be created for example using a current carrying wire in proximity to the SQUID. Thus the synthetic gauge field generator 160 in this implementation is the coupling SQUID 180 biased with a static magnetic field. Further details of the architecture of microwave transmission line TDAs 110 are provided in Jen Koch et al., *Physical Review A*, Vol. 82, 043811 (2010) (referred to hereinafter as Koch), the entirety of which is incorporated herein by reference.

Microwave transmission line TDAs 110 of this type give rise to a topological band structure including band gaps between bulk energy bands, and in a finite geometry, edge states in the band gaps generally as described above for the optical implementation 600 of the amplifier 100 although the specific details of the band structure and edge states will be different than that shown in FIGS. 2B to 2D due to the different configuration of the lattice in the TDA 110 of the microwave transmission line implementation 500 shown herein.

In this microwave transmission line implementation 500 of the amplifier 100, a driving SQUID 185, comprising two Josephson junctions, is coupled to each waveguide resonator 120. The driving SQUID 185 produces a pair of photons when driven by a time-dependent magnetic flux. The amplifier 100, 500 thus includes a magnetic flux generator (created by a current carrying wire, not shown) configured to produce a time dependent magnetic field at each driving SQUID 185. Thus, the plurality of driving SQUIDs 185 along with the associated magnetic flux generator thus form the parametric driving element 170 in this microwave transmission line implementation of the amplifier 100. As in the optical implementation 600 of the amplifier 100, the frequency of the time dependent magnetic flux is selected so as to produce two photons having an energy and quasiparticle momentum which can excite a desired edge state in this implementation of the amplifier 100 and to cause amplification of a signal corresponding to that edge state.

It is further contemplated that only some of the microwave transmission line resonators 120 of the TDA 110 could have a driving SQUID 185 coupled thereto. For example, it is contemplated that only a subset of the resonators 120 along the edge where amplification is desired could have a corresponding driving SQUID 185 coupled thereto.

In this microwave transmission line implementation 500 of the amplifier 100, each of the input, output and sink lines 130, 140, 150 is an electrical transmission line. As in the optical implementation 600 of the amplifier 100 discussed above, the input and output lines 130, 140 (not shown in FIG. 6) are each coupled to a microwave transmission line resonator 120 along one edge to form an input resonator 122 (not shown in FIG. 6 and an output resonator 124 (not shown in FIG. 6) such that a wave traveling leftwardly from the input resonator 122 to the output resonator 124 is amplified. The sink line 150 is coupled to microwave transmission line resonator 120 along the opposite edge so that a wave traveling from the output resonator 124 towards the input resonator 122 exits the TDA 110 before it reaches the input resonator 122.

It is contemplated that the microwave transmission line amplifier 500, 100 could be realized in a TDA 110 having a symmetry other than triangular.

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

What is claimed is:

1. A topologically-protected traveling-wave amplifier comprising:

a plurality of resonators arranged in a two-dimensional array (TDA), the plurality of resonators being arranged to define a periphery including a first edge, each resonator being coupled to neighboring resonators of the TDA;

an input line coupled to an input resonator of the plurality of resonators, the input resonator being disposed along the first edge;

an output line coupled to an output resonator of the plurality of resonators, the output resonator being disposed along the first edge and being spaced from the input resonator by at least one other resonator of the plurality of resonators;

a synthetic gauge field generator (SGFG) associated with the plurality of resonators, the SGFG and the plurality of resonators being configured to provide a topologically-protected edge state for the TDA, the topologically-protected edge state corresponding to propagation along the periphery in a propagation direction from the input resonator along the first edge to the output resonator; and a parametric driving element coupled to the plurality of resonators, the parametric driving element being configured to create pairs of photons in the topologically protected edge state and thereby amplify a signal propagating along the first edge in the propagation direction, whereby an input signal incident from the input line on the input resonator propagates in the propagation direction along the first edge while being amplified and is detected at the output line as an amplified signal, and a signal incident from the output line is attenuated before emerging at the input resonator.

2. The amplifier of claim 1, wherein:

each of the plurality of resonators is an optical cavity fabricated from a nonlinear optical material, and adapted to support clockwise and counter-clockwise propagating modes;

each of the input line and the output line is an optical fiber;

the SGFG comprises a plurality of asymmetric waveguide loops coupling neighboring resonators such that propagation phases become direction-dependent; and the parametric driving element comprises a pump laser configured to emit pump photons, each pump photon incident on any resonator being down-converted to a pair of down-converted photons having a frequency and momentum corresponding to the at least one topologically protected edge state.

3. The amplifier of claim 2, wherein the optical cavity is an optical ring resonator.

4. The amplifier of claim 2, wherein the plurality of resonators is arranged to form a square lattice.

5. The amplifier of claim 1, wherein:
each of the plurality of resonators is a microwave cavity;
each of the input line and the output line is a microwave transmission line;
the SGFG comprises a ferrite particle coupled to one resonator in each plaquette of the TDA; and
the parametric driving element comprises a plurality of superconducting quantum interference devices (SQUIDs) and a magnetic flux generator, each SQUID being coupled to a corresponding one of the plurality of resonators and adapted to produce photons having a frequency and momentum corresponding to the at least one topologically protected edge state when driven with a time-dependent magnetic flux generated by the magnetic flux generator.

6. The amplifier of claim 5, wherein each SQUID is formed of two Josephson junctions.

7. The amplifier of claim 5, wherein the plurality of resonators is arranged to form a square lattice, each plaquette having four resonators.

8. The amplifier of claim 1, wherein:
each of the plurality of resonators is a microwave-frequency transmission line resonator;
each of the input line and the output line is an electrical transmission line;
the SGFG comprises a plurality of coupling SQUIDs, each coupling SQUID connecting together at least two resonators and being biased with a static magnetic field;
the parametric driving element comprises a plurality of driving SQUIDs and a magnetic flux generator, each driving SQUID being coupled to a corresponding one of the resonators and being adapted to produce photons having a frequency and momentum corresponding to the at least one topologically protected edge state when driven with a time-dependent magnetic flux generated by the magnetic flux generator.

9. The amplifier of claim 8, wherein each driving SQUID is formed of two Josephson junctions.

10. The amplifier of claim 8, wherein the plurality of resonators is arranged to form a honeycomb lattice having triangular symmetry with a unit cell having three resonators, each unit cell having a corresponding coupling SQUID, each of the three resonators being coupled to an other of the three resonators via the corresponding coupling SQUID.

11. The amplifier of claim 1, wherein the parametric driving element is coupled to each one of the plurality of resonators.

12. The amplifier of claim 1, wherein the parametric driving element is coupled to each one of the plurality of resonators along the first edge.

13. The amplifier of claim 1, wherein the input line is impedance matched to the input resonator.

14. The amplifier of claim 1, wherein the output line is impedance matched to the output resonator.

15. The amplifier of claim 1, further comprising a sink line coupled to a sink resonator of the plurality of resonators, the sink resonator being other than the input resonator and the output resonator, the sink resonator being disposed along the periphery other than the first edge.

16. The amplifier of claim 15, wherein the sink line is impedance matched to the sink resonator such that a signal propagating to the sink resonator exits the amplifier via the sink waveguide.

17. The amplifier of claim 16, wherein the amplifier is configured as an isolator for isolating the input resonator from signals injected into the output resonator via the output line.

18. The amplifier of claim 1, wherein the input line is adapted to receive a qubit readout signal from a qubit and inject the qubit readout signal into the input resonator.

19. A method of amplifying an input signal comprising:
injecting the input signal at an input resonator of a two-dimensional array (TDA) comprising a plurality of resonators defining a periphery including a first edge, the input resonator being disposed along the periphery, a synthetic gauge field associated with the TDA and being configured to provide a topologically-protected edge state for the TDA corresponding to propagation along the periphery in a propagation direction from the input resonator along at least a portion of the first edge to an output resonator disposed along the periphery;
propagating the input signal along the periphery from the input resonator to the output resonator disposed along the periphery, the input signal propagating along at least a portion of the first edge during its propagation along the periphery from the input resonator to the output resonator;
parametrically driving at least a subset of the plurality of resonators along the first edge so as to amplify the input signal while propagating along the at least one portion of the first edge; and
detecting an amplified signal at the output resonator.

* * * * *